(12) United States Patent
Kato et al.

(10) Patent No.: US 9,007,151 B2
(45) Date of Patent: Apr. 14, 2015

(54) HIGH-FREQUENCY SIGNAL TRANSMISSION LINE AND ELECTRONIC APPARATUS

(71) Applicant: Murata Manufacturing Co., Ltd., Nagaokakyo-shi, Kyoto-fu (JP)

(72) Inventors: Noboru Kato, Nagaokakyo (JP); Shigeru Tago, Nagaokakyo (JP); Jun Sasaki, Nagaokakyo (JP); Junichi Kurita, Nagaokakyo (JP); Satoshi Sasaki, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/151,871

(22) Filed: Jan. 10, 2014

(65) Prior Publication Data

US 2014/0125426 A1 May 8, 2014

Related U.S. Application Data

(63) Continuation of application No. 13/945,947, filed on Jul. 19, 2013, now Pat. No. 8,659,370, which is a continuation of application No. 13/756,867, filed on Feb. 1, 2013, now Pat. No. 8,525,613, which is a continuation of application No. PCT/JP2011/077931, filed on Dec. 2, 2011.

(30) Foreign Application Priority Data

Dec. 3, 2010 (JP) ................................. 2010-270123
May 6, 2011 (JP) ................................. 2011-103644
Sep. 30, 2011 (JP) ................................. 2011-218074

(51) Int. Cl.
*H01P 3/08* (2006.01)
*H05K 1/02* (2006.01)
(Continued)

(52) U.S. Cl.
CPC .............. *H05K 1/025* (2013.01); *H05K 1/0219* (2013.01); *H05K 1/0225* (2013.01);
(Continued)

(58) Field of Classification Search
CPC ........... H01P 3/08; H01P 3/081; H01P 3/085; H01P 3/087; H01P 3/088; H01P 1/047; H03H 7/38; H05K 1/025
See application file for complete search history.

(56) References Cited

U.S. PATENT DOCUMENTS

| 2002/0084876 A1* | 7/2002 | Wright et al. | 333/238 |
| 2010/0225425 A1* | 9/2010 | Cho | 333/238 |
| 2013/0300516 A1 | 11/2013 | Kato et al. | |

FOREIGN PATENT DOCUMENTS

| JP | 2007-123740 A | 5/2007 |
| JP | 2007-242963 A | 9/2007 |
| JP | 2013-084931 A | 5/2013 |

OTHER PUBLICATIONS

Official Communication issued in corresponding Japanese Patent Application No. 2013-106192, mailed on Jan. 21, 2014.
(Continued)

*Primary Examiner* — Stephen E Jones
(74) *Attorney, Agent, or Firm* — Keating & Bennett, LLP

(57) ABSTRACT

An easily bendable high-frequency signal transmission line includes a dielectric body including a protection layer and dielectric sheets laminated on each other, a surface and an undersurface. A signal line is a linear conductor disposed in the dielectric body. A ground conductor is disposed in the dielectric body, faces the signal line via the dielectric sheet, and continuously extends along the signal line. A ground conductor is disposed in the dielectric body, faces the ground conductor via the signal line sandwiched therebetween, and includes a plurality of openings arranged along the signal line. The surface of the dielectric body on the side of the ground conductor with respect to the signal line is in contact with a battery pack.

7 Claims, 42 Drawing Sheets

(51) Int. Cl.
  *H01P 3/02*   (2006.01)
  *H04B 15/00*  (2006.01)
  *H01P 3/10*   (2006.01)
  *H03H 7/38*   (2006.01)
  *H01P 3/12*   (2006.01)
  *H01P 3/00*   (2006.01)
  *H05K 1/03*   (2006.01)
  *H05K 1/11*   (2006.01)
  *H01P 1/203*  (2006.01)

(52) U.S. Cl.
  CPC .......... *H05K 1/0242* (2013.01); *H05K 1/0253*
     (2013.01); *H05K 1/028* (2013.01); *H05K*
     *1/0393* (2013.01); *H05K 1/113* (2013.01);
     *H05K 2201/09618* (2013.01); *H05K 2201/0969*
     (2013.01); *H05K 2201/09727* (2013.01); *H01P*
     *3/026* (2013.01); *H04B 15/00* (2013.01); *H01P*
     *3/10* (2013.01); *H03H 7/38* (2013.01); *H01P*
     *1/20363* (2013.01); *H01P 3/085* (2013.01);
     *H01P 3/121* (2013.01); *H01P 3/08* (2013.01);
     *H01P 3/003* (2013.01)

(56) References Cited

OTHER PUBLICATIONS

Kato et al., "High-Frequency Signal Transmission Line and Electronic Apparatus", U.S. Appl. No. 13/756,867, filed Feb. 1, 2013.
Kato et al., "High-Frequency Signal Transmission Line and Electronic Apparatus", U.S. Appl. No. 13/945,950, filed Jul. 19, 2013.
Kato et al., "High-Frequency Signal Transmission Line and Electronic Apparatus", U.S. Appl. No. 13/945,947, filed Jul. 19, 2013.
Kato et al., "High-Frequency Signal Transmission Line and Electronic Apparatus", U.S. Appl. No. 14/151,867, filed Jan. 10, 2014.
Official Communication issued in corresponding Japanese Patent Application No. 2013-139452, mailed on Sep. 2, 2014.
Official Communication issued in corresponding Japanese Patent Application No. 2013-106192, mailed on Aug. 5, 2014.

* cited by examiner

FIG. 9
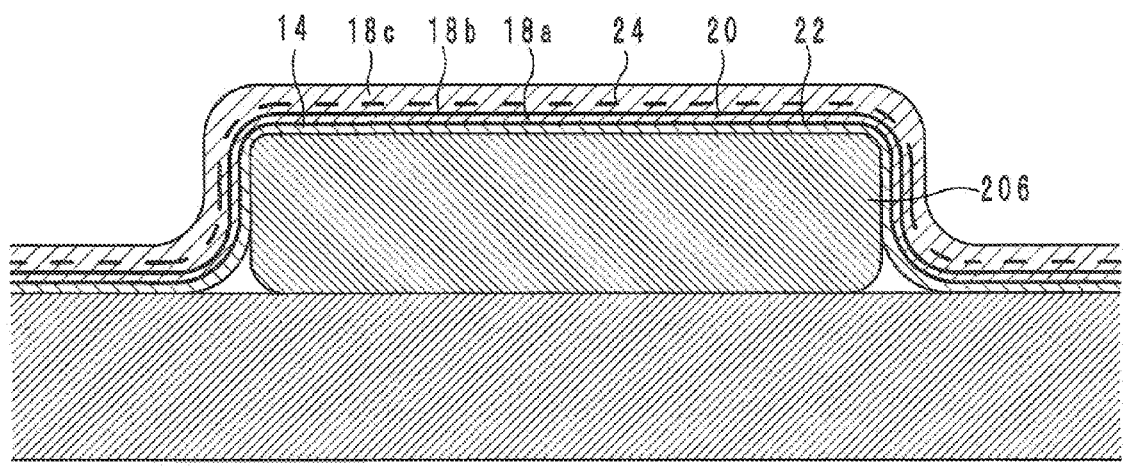
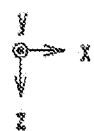

FIG. 18
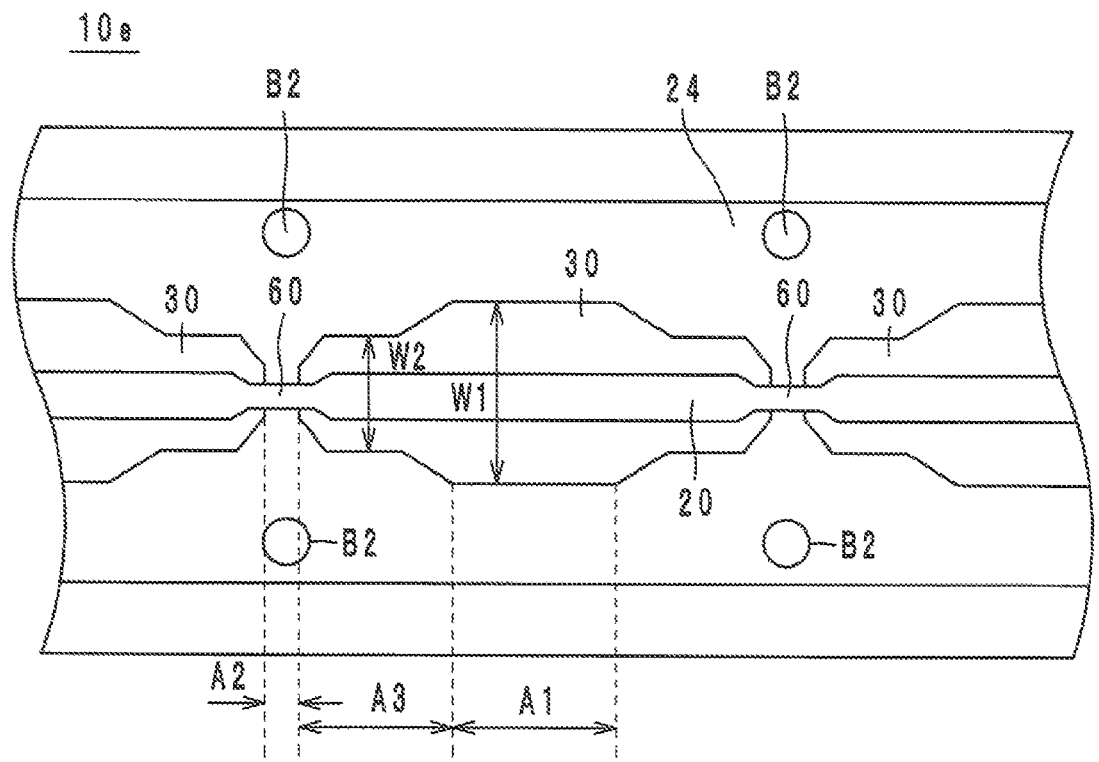
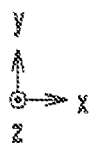

FIG. 19
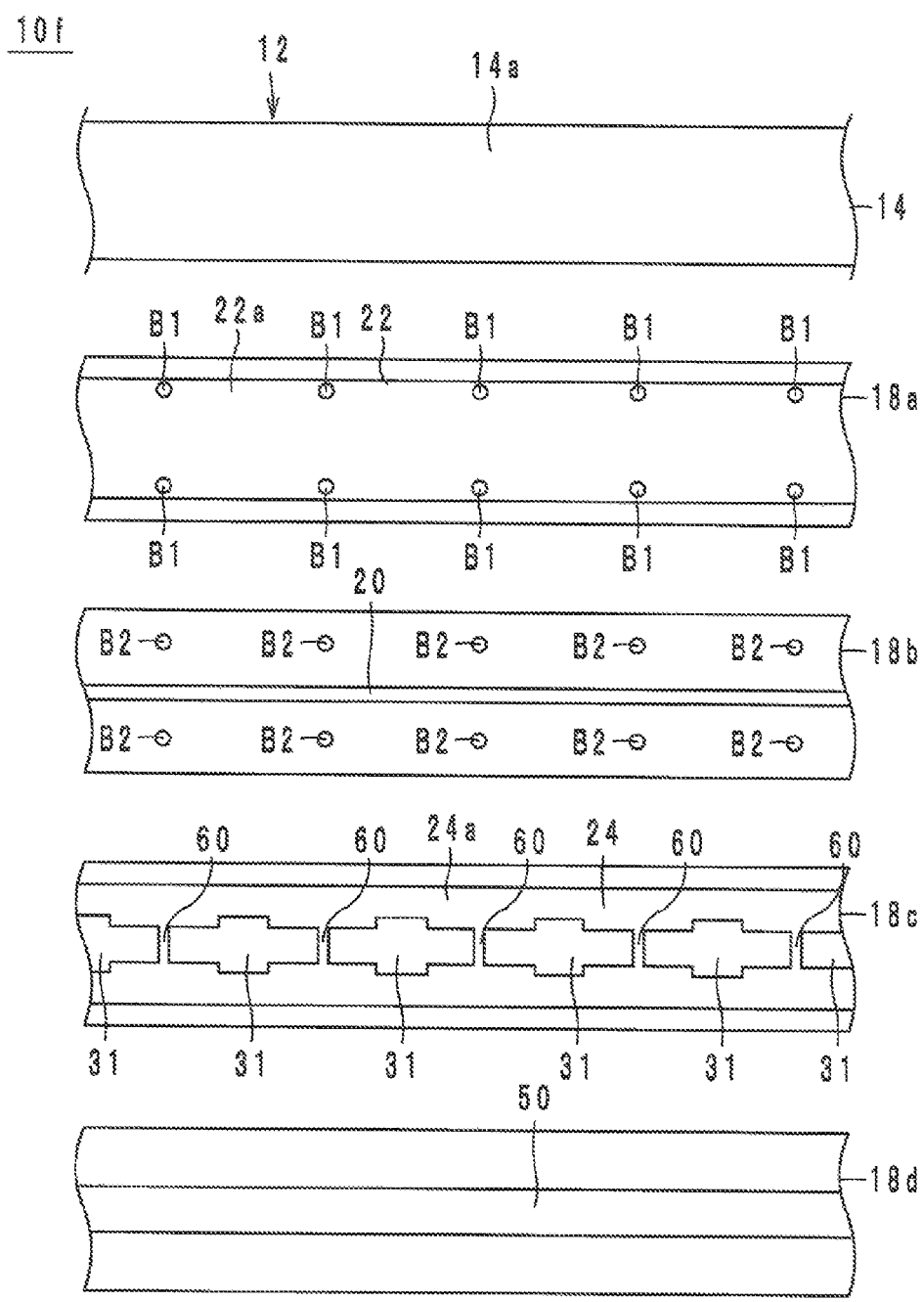

FIG. 20
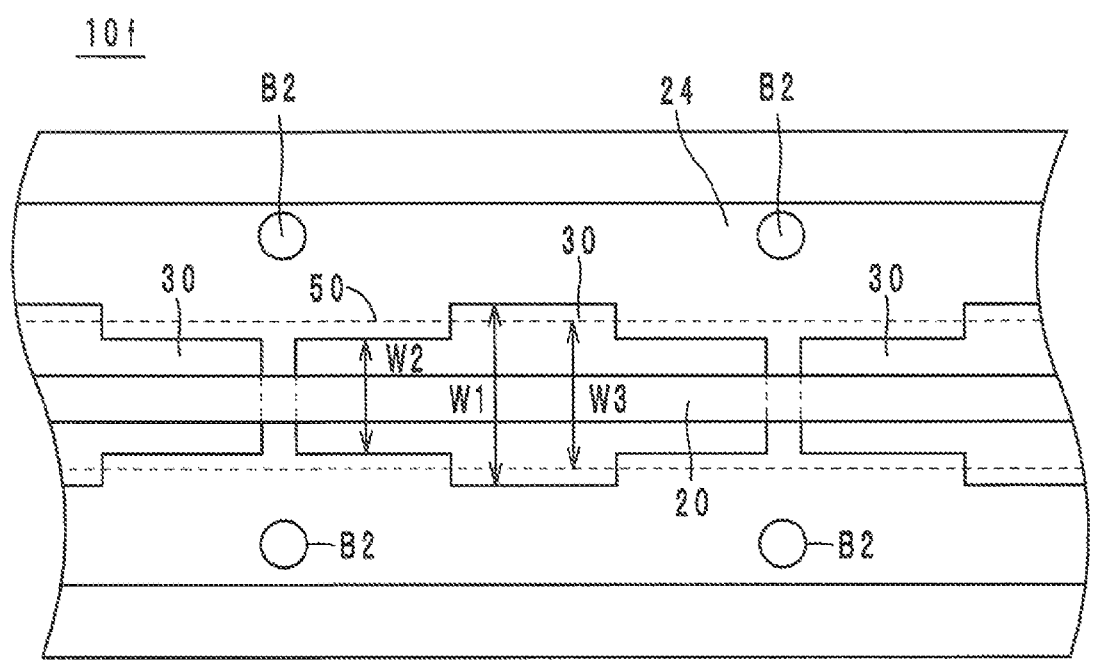
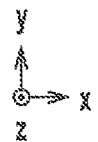

FIG. 22
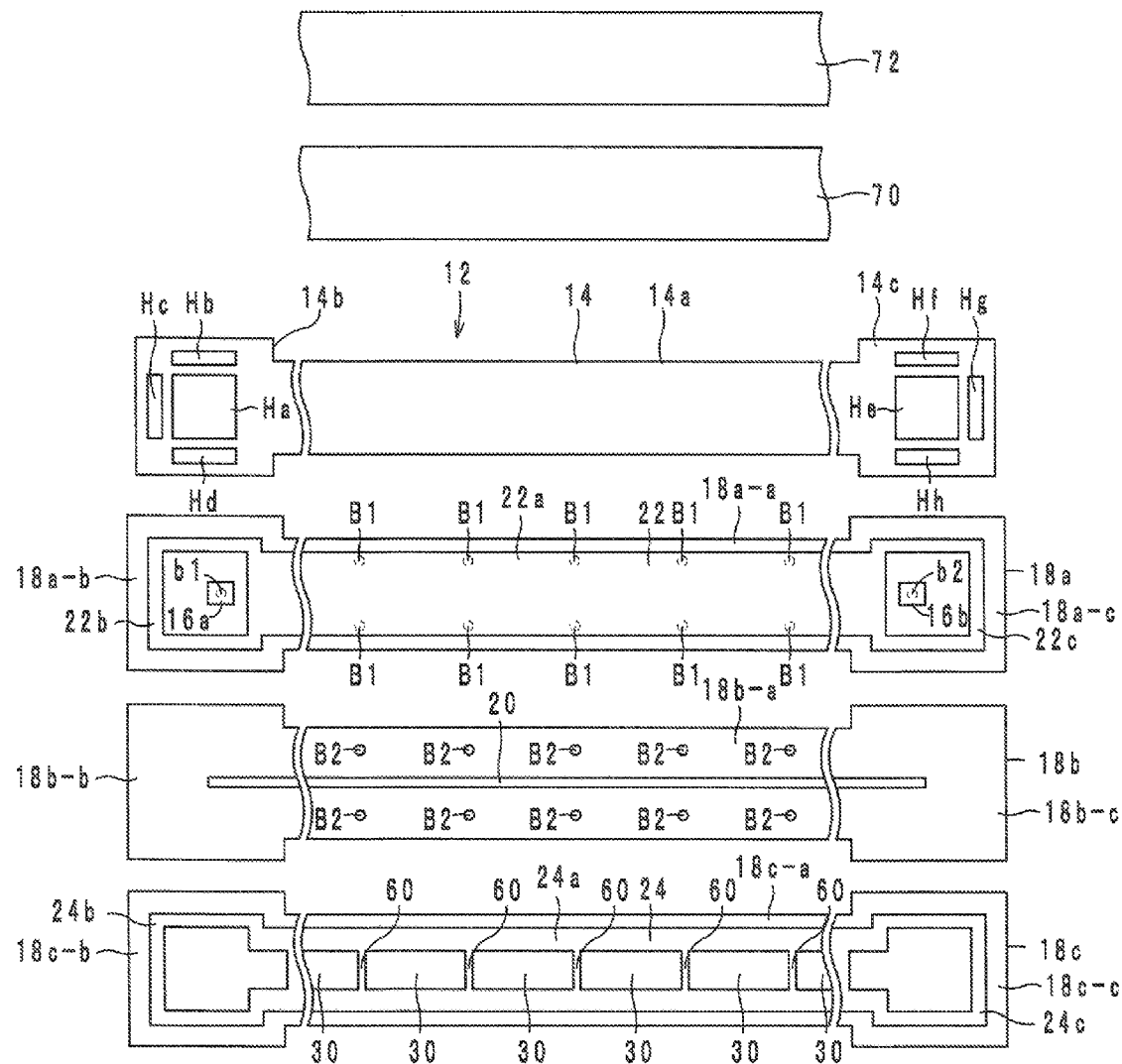
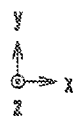

HIGH-FREQUENCY SIGNAL TRANSMISSION LINE AND ELECTRONIC APPARATUS

BACKGROUND OF THE INVENTION

1. Field of the Invention

The present invention relates to high-frequency signal transmission lines and electronic apparatuses, and, more particularly, to a high-frequency signal transmission line including a signal line and ground conductors facing the signal line and an electronic apparatus.

2. Description of the Related Art

As a high-frequency transmission line for connecting high-frequency circuits, a coaxial cable is generally used. Since coaxial cables are easily deformed (bent) and are inexpensive, they are widely used.

In recent years, high-frequency apparatuses such as mobile communication terminals have been miniaturized. Accordingly, in such a high-frequency apparatus, it is difficult to obtain the space required for a coaxial cable having a circular cross section. A high-frequency signal transmission line obtained by forming a strip line in a flexible laminate is therefore sometimes used.

Triplate strip lines have a structure in which a signal line is sandwiched between ground conductors. Since the thickness of such a high-frequency signal transmission line in a lamination direction is smaller than the diameters of coaxial cables, the high-frequency signal transmission line can fit into a small space into which the coaxial cables cannot fit.

As an invention related to the high-frequency signal transmission line, a flexible substrate disclosed in Japanese Unexamined Patent Application Publication No. 2007-123740 is known. In the flexible substrate disclosed in Japanese Unexamined Patent Application Publication No. 2007-123740, since a ground conductor has an opening portion, a strip line can be more easily bent as compared with a strip line sandwiched between ground conductors formed on the entire surfaces.

However, in the flexible substrate disclosed in Japanese Unexamined Patent Application Publication No. 2007-123740, an electromagnetic field may exit from the opening portion to the outside of the flexible substrate. In a case where an article, such as a dielectric or a metal body, is disposed around the flexible substrate, electromagnetic field coupling occurs between the signal line in the flexible substrate and the article. As a result, the characteristic impedance of the signal line in the flexible substrate may deviate from a predetermined characteristic impedance.

SUMMARY OF THE INVENTION

Preferred embodiments of the present invention provide a high-frequency signal transmission line that can be easily bent and can significantly reduce and prevent deviation of a characteristic impedance of a signal line included therein from a predetermined characteristic impedance, and also provide an electronic apparatus.

A high-frequency signal transmission line according to a preferred embodiment of the present invention includes a laminate including laminated insulating layers, a first main surface and a second main surface, a linear signal line that is disposed in the laminate, a first ground conductor that is disposed in the laminate, faces the signal line via one of the insulating layers, and continuously extends along the signal line, and a second ground conductor that is disposed in the laminate, faces the first ground conductor via the signal line sandwiched therebetween, and includes a plurality of openings arranged along the signal line. The first main surface located on a side of the first ground conductor with respect to the signal line is a surface to be in contact with an article.

A high-frequency signal transmission line according to another preferred embodiment of the present invention includes an element assembly including a first main surface and a second main surface, a linear signal line disposed in the element assembly, a first ground conductor that is disposed on a side of the first main surface with respect to the signal line in the element assembly and faces the signal line, and a second ground conductor that faces the first ground conductor via the signal line sandwiched therebetween in the element assembly, and includes an opening arranged along the signal line, an adhesive layer located on the first main surface, and a cover layer releasably attached to the adhesive layer.

An electronic apparatus according to a preferred embodiment of the present invention includes the high-frequency signal transmission line and an article. The high-frequency signal transmission line is fixed to the article via the adhesive layer from which the cover layer has been detached.

According to various preferred embodiments of the present invention, a signal line can be easily bent, and the deviation of the characteristic impedance of the signal line from a predetermined characteristic impedance can be significantly reduced and prevented.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 9 is a cross-sectional view of a high-frequency signal transmission line and a battery pack to which the high-frequency signal transmission line is fixed with an installation method according to a second modification of the first preferred embodiment of the present invention.

FIG. 18 is a perspective view of the high-frequency signal transmission line illustrated in FIG. 17 from the z-axis direction.

FIG. 19 is an exploded view of a laminate in a high-frequency signal transmission line according to a sixth modification of the first preferred embodiment of the present invention.

FIG. 20 is a perspective view of the high-frequency signal transmission line illustrated in FIG. 19 from the z-axis direction.

FIG. 22 is an exploded view of a dielectric body in the high-frequency signal transmission line illustrated in FIG. 21.

DETAILED DESCRIPTION OF THE PREFERRED EMBODIMENTS

First Preferred Embodiment

A high-frequency signal transmission line and an electronic apparatus according to the first preferred embodiment of the present invention will be described below with reference to the accompanying drawings.

Figure 1:
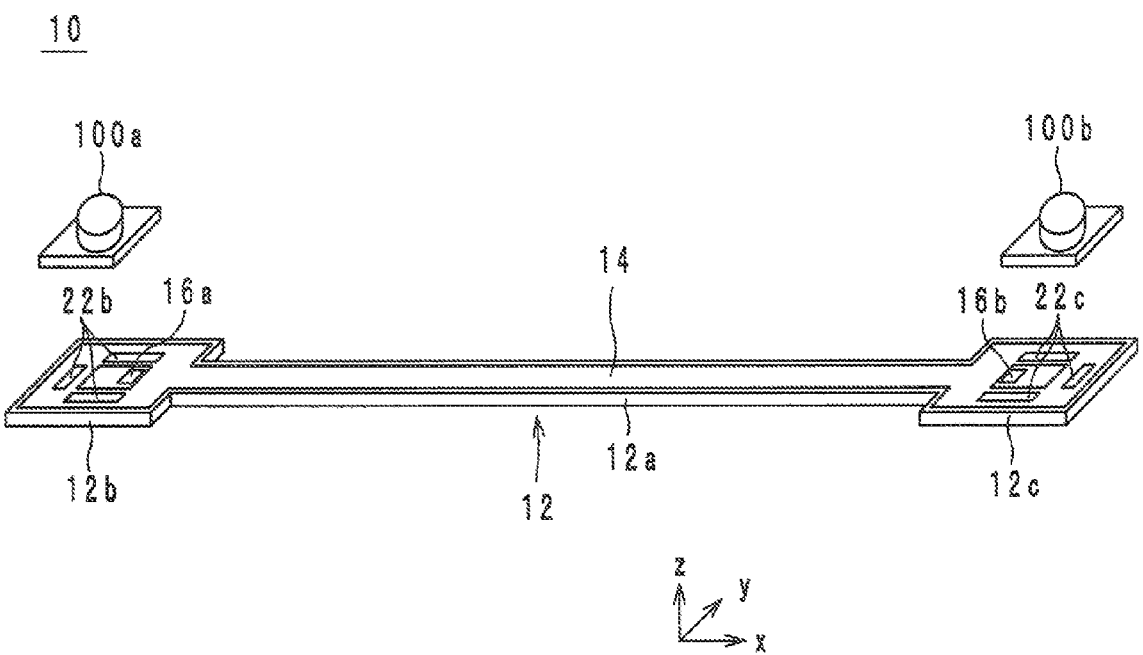
FIG. 1 is an external perspective view of a high-frequency signal transmission line according to a first preferred embodiment of the present invention.
Figure 2:
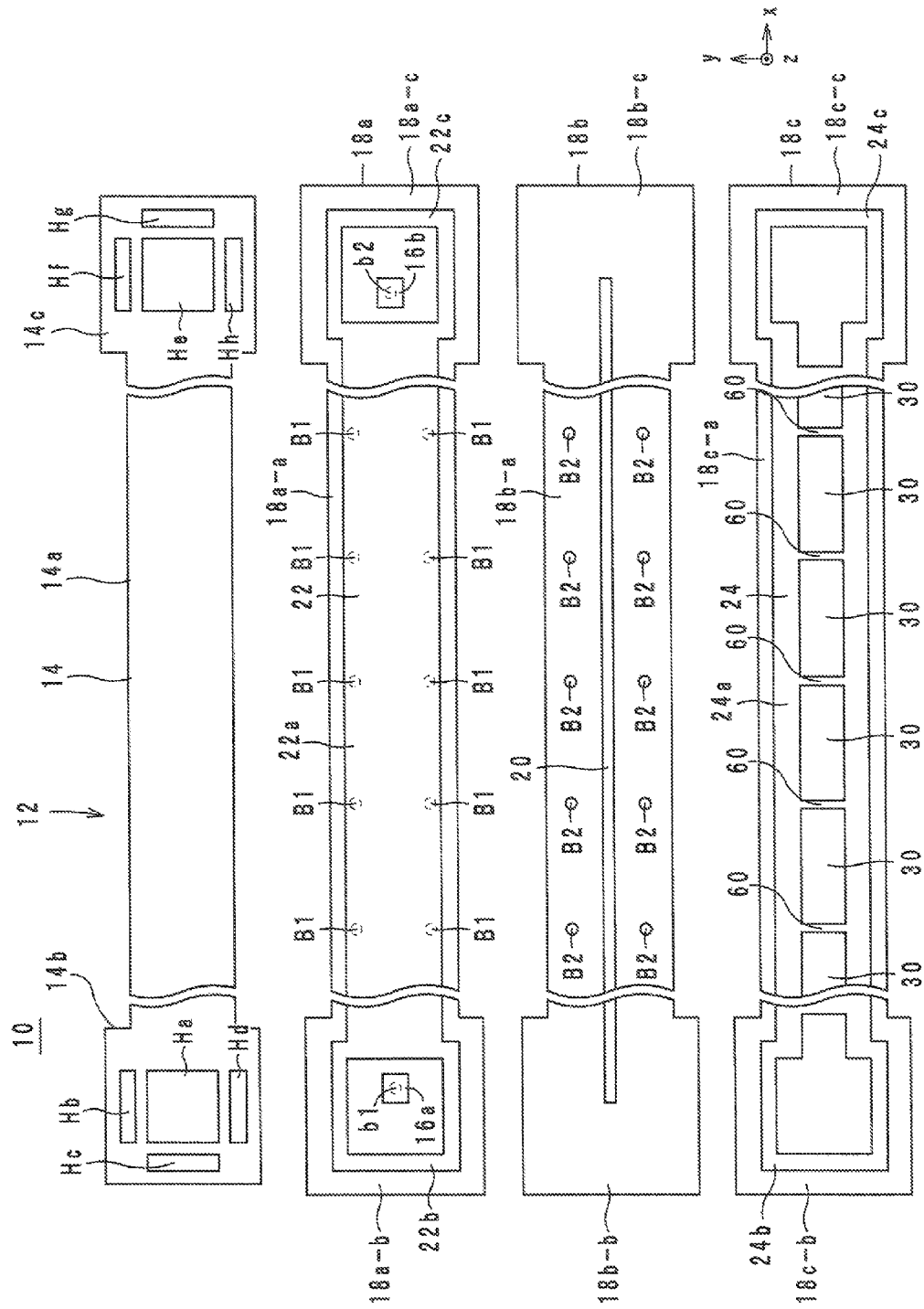
FIG. 2 is an exploded view of a dielectric body in the high-frequency signal transmission line illustrated in FIG. 1.
Figure 3:
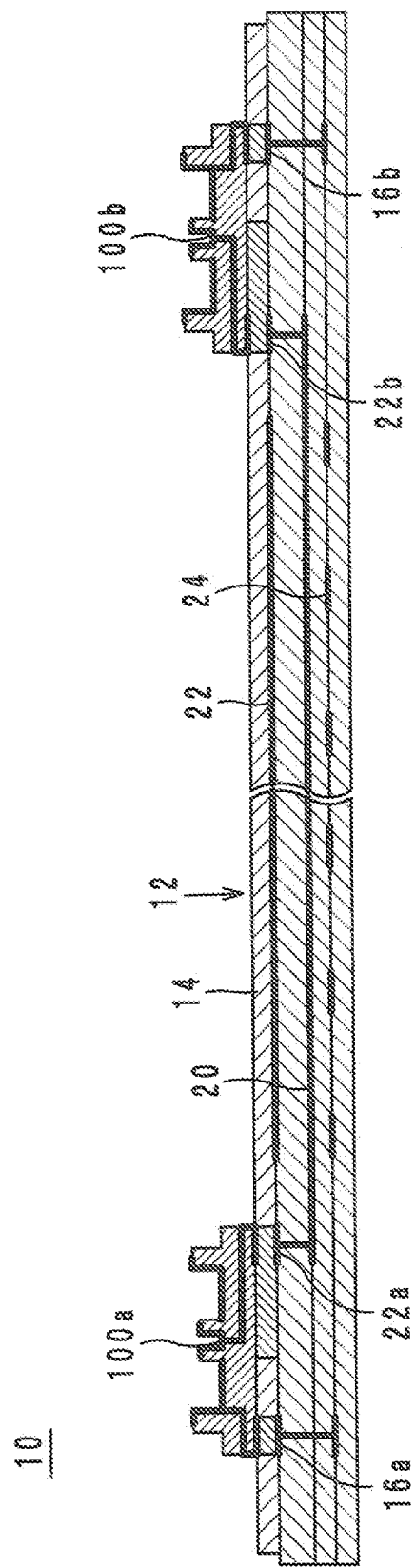
FIG. 3 is a cross-sectional view of the high-frequency signal transmission line illustrated in FIG. 1.
Figure 4:
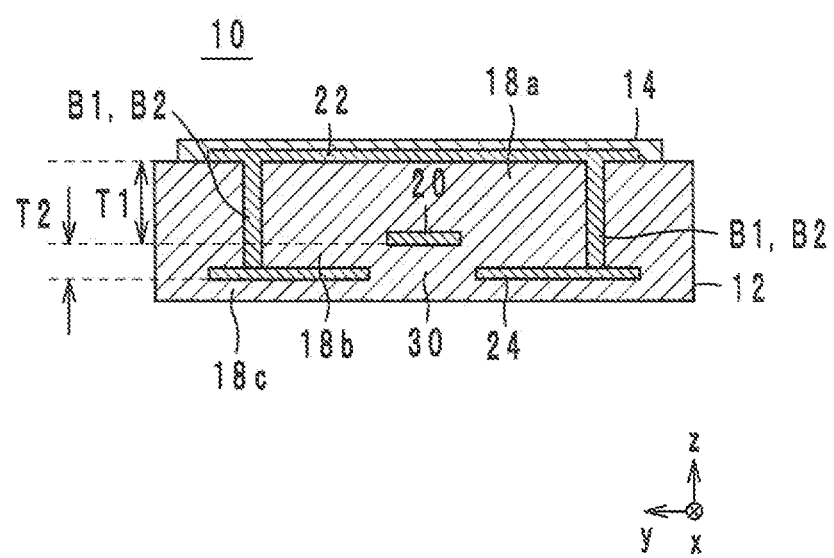
FIG. 4 is a cross-sectional view of a high-frequency signal transmission line.
Figure 5A:
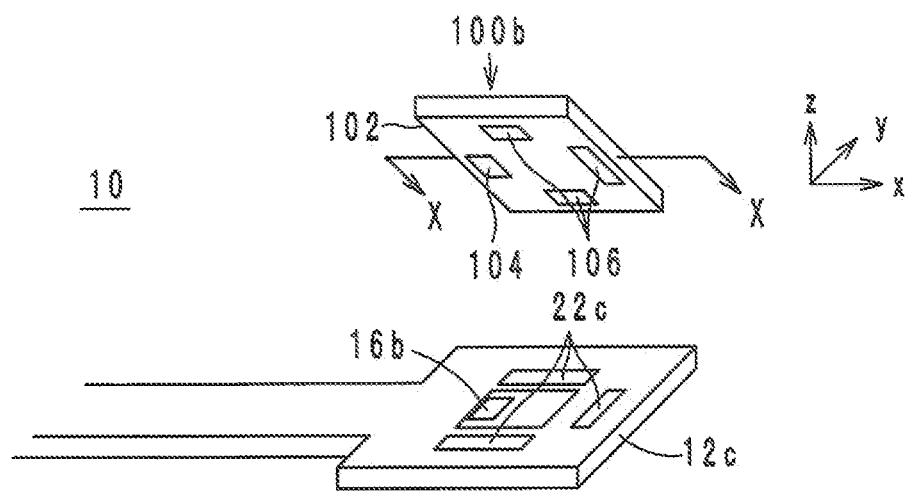
FIGS. 5A and 5B are an external perspective view and a cross-sectional view of a connector in a high-frequency signal transmission line.
Figure 5B:
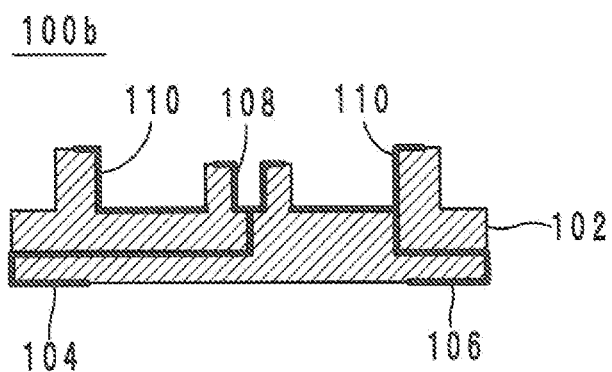

The structure of a high-frequency signal transmission line according to the first preferred embodiment of the present invention will be described below with reference to the accompanying drawings. FIG. 1 is an external perspective view of a high-frequency signal transmission line 10 according to the first preferred embodiment of the present invention. FIG. 2 is an exploded view of a dielectric body 12 in the high-frequency signal transmission line 10 illustrated in FIG. 1. FIG. 3 is a cross-sectional view of the high-frequency signal transmission line 10 illustrated in FIG. 1. FIG. 4 is a cross-sectional view of the high-frequency signal transmission line 10. FIGS. 5A and 5B are an external perspective view and a cross-sectional view of a connector 100b in the high-frequency signal transmission line 10. Referring to FIGS. 1 to 5B, a lamination direction in the high-frequency signal transmission line 10 is defined as a z-axis direction, a longitudinal direction in the high-frequency signal transmission line 10 is defined as an x-axis direction, and a direction orthogonal to the x-axis direction and the z-axis direction is defined as a y-axis direction.

For example, the high-frequency signal transmission line 10 preferably is used to connect two high-frequency circuits in an electronic apparatus such as a mobile telephone. As illustrated in FIGS. 1 to 3, the high-frequency signal transmission line 10 includes the dielectric body 12, an external terminal 16 (16a and 16b), a signal line 20, ground conductors 22 and 24, via-hole conductors b1, b2, B1, and B2, and connectors 100a and 100b.

The dielectric body 12 extends in the x-axis direction in plan view from the z-axis direction, and includes a line portion 12a and connection portions 12b and 12c. The dielectric body 12 is a laminate obtained by laminating a protection layer and dielectric sheets (insulating layers) 18 (18a to 18c), which are illustrated in FIG. 2, in this order from a positive z-axis direction to a negative z-axis direction. In the following description, the main surface of the dielectric body 12 in the positive z-axis direction is referred to as a surface (first main surface) and the main surface of the dielectric body 12 in the negative z-axis direction is referred to as an undersurface (second main surface).

The line portion 12a extends in the x-axis direction. The connection portion 12b is connected to the end of the line portion 12a in a negative x-axis direction, and the connection portion 12c is connected to the end of the line portion 12a in a positive x-axis direction. The connection portions 12b and 12c preferably are rectangular or substantially rectangular in shape, for example. The width of the connection portions 12b and 12c in the y-axis direction is larger than that of the line portion 12a in the y-axis direction.

The dielectric sheet 18 extends in the x-axis direction in plan view from the z-axis direction, and preferably has the same or substantially the same shape as the dielectric body 12. The dielectric sheet 18 is made of a thermoplastic resin such as polyimide or liquid crystal polymer having flexibility. As illustrated in FIG. 4, a thickness T1 of the dielectric sheet 18a is larger than a thickness T2 of the dielectric sheet 18b. For example, after the dielectric sheets 18a to 18c have been laminated, the thickness T1 is preferably in the range of about 50 μm to about 300 μm, for example. In this preferred embodiment, the thickness T1 preferably is about 150 μm, for example. The thickness T2 preferably is in the range of about 10 μm to about 100 μm, for example. In this preferred embodiment, the thickness T2 preferably is about 50 μm, for example. In the following description, the main surface of the dielectric sheet 18 in the positive z-axis direction is referred to as a surface, and the main surface of the dielectric sheet 18 in the negative z-axis direction is referred to as an undersurface.

The dielectric sheet 18a includes a line portion 18a-a and connection portions 18a-b and 18a-c. The dielectric sheet 18b includes a line portion 18b-a and connection portions 18b-b and 18b-c. The dielectric sheet 18c includes a line portion 18c-a and connection portions 18c-b and 18c-c. The line portions 18a-a, 18b-a, and 18c-a define the line portion 12a. The connection portions 18a-b, 18b-b, and 18c-b define the connection portion 12b. The connection portions 18a-c, 18b-c, and 18c-c define the connection portion 12c.

As illustrated in FIGS. 1 and 2, an external terminal 16a preferably is a rectangular or substantially rectangular conductor disposed near the center of the surface of the connection portion 18a-b. As illustrated in FIGS. 1 and 2, an external terminal 16b preferably is a rectangular or substantially rectangular conductor disposed near the center of the surface of the connection portion 18a-c. The external terminals 16a and 16b are made of a metal material such as silver or copper having low resistivity, for example. The surfaces of the external terminals 16a and 16b preferably are gold-plated.

As illustrated in FIG. 2, the signal line 20 is a linear conductor disposed in the dielectric body 12, and extends in the x-axis direction on the surface of the dielectric sheet 18b. Both ends of the signal line 20 individually overlap the external terminals 16a and 16b in plan view from the z-axis direction. For example, the line width of the signal line 20 preferably is in the range of about 100 μm to about 500 μm, for example. In this preferred embodiment, the line width of the signal line 20 preferably is about 240 μm, for example. The signal line 20 is made of a metal material such as silver or copper having low resistivity.

As illustrated in FIG. 2, in the dielectric body 12, the ground conductor 22 (first ground conductor) is disposed in the positive z-axis direction with respect to the signal line 20, and, more specifically, is disposed on the surface of the dielectric sheet 18a nearest to the surface of the dielectric body 12. The ground conductor 22 extends in the x-axis direction on the surface of the dielectric sheet 18a, and faces the signal line 20 via the dielectric sheet 18a. Substantially no opening is disposed at the ground conductor 22. That is, the ground conductor 22 is a solid electrode that continuously extends in the x-axis direction along the signal line 20 in the line portion 12a. The ground conductor 22 does not necessarily have to completely cover the line portion 12a. For example, in order to let gas generated by heat bonding of the dielectric sheet 18 made of a thermoplastic resin escape, a small hole may be provided at a predetermined position on the ground conductor 22. The ground conductor 22 preferably is made of a metal material such as silver or copper having low resistivity, for example.

The ground conductor 22 includes a line portion 22a and terminal portions 22b and 22c. The line portion 22a is disposed on the surface of the line portion 18a-a, and extends in the x-axis direction. The terminal portion 22b is disposed on the surface of the line portion 18a-b, and preferably is a rectangular or substantially rectangular ring surrounding the external terminal 16a. The terminal portion 22b is connected to the end of the line portion 22a in the negative x-axis direction. The terminal portion 22c is disposed on the surface of the line portion 18a-c, and preferably is a rectangular or substantially rectangular ring surrounding the external terminal 16b. The terminal portion 22c is connected to the end of the line portion 22a in the positive x-axis direction.

As illustrated in FIG. 2, in the dielectric body 12, the ground conductor 24 (second ground conductor) is disposed in the negative z-axis direction with respect to the signal line 20, and, more specifically, is disposed on the surface of the dielectric sheet 18c. The ground conductor 24 is therefore disposed between the dielectric sheets 18b and 18c. The ground conductor 24 extends in the x-axis direction on the surface of the dielectric sheet 18c, and faces the signal line 20 via the dielectric sheet 18b. That is, the ground conductor 24 faces the ground conductor 22 via the signal line 20 sandwiched therebetween. The ground conductor 24 preferably is made of a metal material such as silver or copper having low resistivity, for example.

The ground conductor 24 includes a line portion 24a and terminal portions 24b and 24c. The line portion 24a is disposed on the surface of the line portion 18c-a, and extends in the x-axis direction. The line portion 24a has a ladder shape obtained by alternately disposing a plurality of openings 30 at which no conductive layer is provided and a plurality of bridge portions 60 at which a conductive layer is arranged along the signal line 20. As illustrated in FIGS. 2 and 4, the openings 30 preferably are rectangular or substantially rectangular in shape and overlap the signal line 20 in plan view from the z-axis direction. Accordingly, the signal line 20 alternately overlaps the openings and the bridge portions 60 in plan view from the z-axis direction. The openings 30 are arranged at regular intervals.

The terminal portion 24b is disposed on the surface of the line portion 18c-b, and preferably is a rectangular or substantially rectangular ring. The terminal portion 24b is connected to the end of the line portion 24a in the negative x-axis direction. The terminal portion 24c is disposed on the surface of the line portion 18c-c, and preferably is a rectangular or substantially rectangular ring. The terminal portion 24c is connected to the end of the line portion 24a in the positive x-axis direction.

As described previously, the signal line 20 is sandwiched between the ground conductors 22 and 24 via the dielectric layers 18a and 18b. That is, the signal line 20 and the ground conductors 22 and 24 define a triplate strip line structure. As illustrated in FIG. 4, the distance between the signal line 20 and the ground conductor 22 is substantially equal to the thickness T1 of the dielectric sheet 18a, and, for example, is preferably in the range of about 50 μm to about 300 μm, for example. In this preferred embodiment, the distance between the signal line 20 and the ground conductor 22 preferably is about 150 μm, for example. On the other hand, as illustrated in FIG. 4, the distance between the signal line 20 and the ground conductor 24 is substantially equal to the thickness T2 of the dielectric sheet 18b, and, for example, preferably is in the range of about 10 μm to about 100 μm, for example. In this preferred embodiment, the distance between the signal line 20 and the ground conductor 24 preferably is about 50 μm, for example. That is, design is performed so that the thickness T1 is larger than the thickness T2.

Thus, by making the thickness T1 larger than the thickness T2, the capacitance generated between the ground conductor 22 and the signal line 20 becomes small and the line width of the signal line 20 can be increased so as to obtain a predetermined impedance (for example, about 50 Ω). As a result, a transmission loss can be reduced and the electrical characteristic of a high-frequency signal transmission line can be improved. In this preferred embodiment, impedance design is performed mainly in consideration of the capacitance generated between the ground conductor 22 and the signal line 20. Impedance design for the ground conductor 24 is performed so as to significantly reduce and prevent the emission of a signal. That is, by setting a high characteristic impedance (for example, about 70 Ω) at the ground conductor 22 and the signal line 20 and adding the ground conductor 24, a low-impedance (for example, about 30 Ω) area is provided at the high-frequency signal transmission line. As a result, the impedance of the high-frequency signal transmission line becomes a predetermined impedance (for example, about 50 Ω).

The via-hole conductor b1 passes through the connection portion 18a-b of the dielectric sheet 18a in the z-axis direction, and connects the external terminal 16a and the end of the signal line 20 in the negative x-axis direction. The via-hole conductor b2 passes through the connection portion 18a-c of the dielectric sheet 18a in the z-axis direction, and connects the external terminal 16b and the end of the signal line 20 in the positive x-axis direction. As a result, the signal line 20 is connected between the external terminals 16a and 16b. The via-hole conductors b1 and b2 are preferably made of a metal material such as silver or copper having low resistivity, for example.

The via-hole conductors B1 pass through the line portion 18a-a of the dielectric sheet 18a in the z-axis direction, and are disposed at the line portion 18a-a. The via-hole conductors B2 pass through the line portion 18b-a of the dielectric sheet 18b in the z-axis direction, and are disposed at the line portion 18b-a. The via-hole conductor B1 and the via-hole conductor B2 are connected to each other, so that a single via-hole conductor is provided and connects the ground conductors 22 and 24. The via-hole conductors B1 and B2 preferably are made of a metal material such as silver or copper having low resistivity, for example.

The protection layer 14 covers the substantially entire surface of the dielectric sheet 18a. As a result, the protection layer 14 covers the ground conductor 22. For example, the protection layer 14 is made of a flexible resin such as a resist material.

As illustrated in FIG. 2, the protection layer 14 includes a line portion 14a and connection portions 14b and 14c. The line portion 14a covers the entire surface of the line portion 18a-a, thereby covering the line portion 22a.

The connection portion 14b is connected to the end of the line portion 14a in the negative x-axis direction, and covers the surface of the connection portion 18a-b. At the connection portion 14b, openings Ha to Hd are provided. The opening Ha preferably is a rectangular or substantially rectangular opening located at the center of the connection portion 14b. The external terminal 16a is exposed to the outside via the opening Ha. The opening Hb preferably is a rectangular or substantially rectangular opening located in the positive y-axis direction with respect to the opening Ha. The opening Hc preferably is a rectangular or substantially rectangular opening arranged in the negative x-axis direction with respect to the opening Ha. The opening Hd preferably is a rectangular or substantially rectangular opening arranged in the negative y-axis direction with respect to the opening Ha. The terminal portion 22b is exposed to the outside via the openings Hb to Hd so as to define and function as an external terminal.

The connection portion 14c is connected to the end of the line portion 14a in the positive x-axis direction, and covers the surface of the connection portion 18a-c. At the connection portion 14c, openings He to Hh are disposed. The opening He preferably is a rectangular or substantially rectangular opening located at the center of the connection portion 14c. The external terminal 16b is exposed to the outside via the opening He. The opening Hf preferably is a rectangular or substantially rectangular opening located in the positive y-axis direction with respect to the opening He. The opening Hg preferably is a rectangular or substantially rectangular opening located in the positive x-axis direction with respect to the opening He. The opening Hh preferably is a rectangular or substantially rectangular opening located in the negative y-axis direction with respect to the opening He. The terminal portion 22c is exposed to the outside via the openings Hf to Hh so as to define and function as an external terminal.

The connectors 100a and 100b are disposed on the surfaces of the connection portions 12b and 12c, respectively. Since the structures of the connectors 100a and 100b are the same, the structure of the connector 100b will be described below by way of example.

As illustrated in FIGS. 1, 5A and 5B, the connector 100b includes a connector body 102, external terminals 104 and 106, a center conductor 108, and external conductors 110. The connector body 102 preferably has a shape obtained by coupling a cylinder with a rectangular or substantially rectangular plate and is made of an insulating material such as a resin, for example.

The external terminal 104 is disposed on the surface of the plate of the connector body 102 in the negative z-axis direction so that it faces the external terminal 16b. The external terminals 106 are disposed on the surface of the plate of the connector body 102 in the negative z-axis direction so that the positions of the external terminals 106 individually correspond to the positions of the openings Hf to Hh through which the terminal portion 22c is exposed to the outside.

The center conductor 108 is disposed at the center of the cylinder of the connector body 102, and is connected to the external terminal 104. The center conductor 108 is a signal terminal arranged to receive or output a high-frequency signal. The external conductors 110 are disposed on the inner peripheral surface of the cylinder of the connector body 102, and are connected to the external terminals 106. The external conductors 110 are ground terminals holding the ground potential.

The connector 100b having the above-described structure is disposed on the surface of the connection portion 12c so that the external terminal 104 is connected to the external terminal 16b and the external terminals 106 are connected to the terminal portion 22c. As a result, the signal line 20 is electrically connected to the center conductor 108. The ground conductors 22 and 24 are electrically connected to the external conductors 110.

Figure 6A:
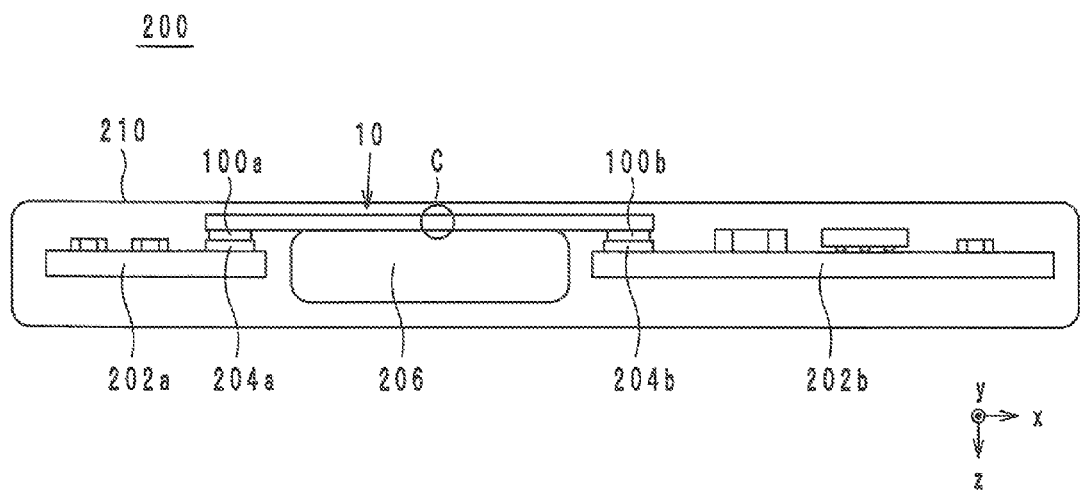
FIGS. 6A and 6B are plan views of an electronic apparatus including a high-frequency signal transmission line from a y-axis direction and a z-axis direction.
Figure 6B:
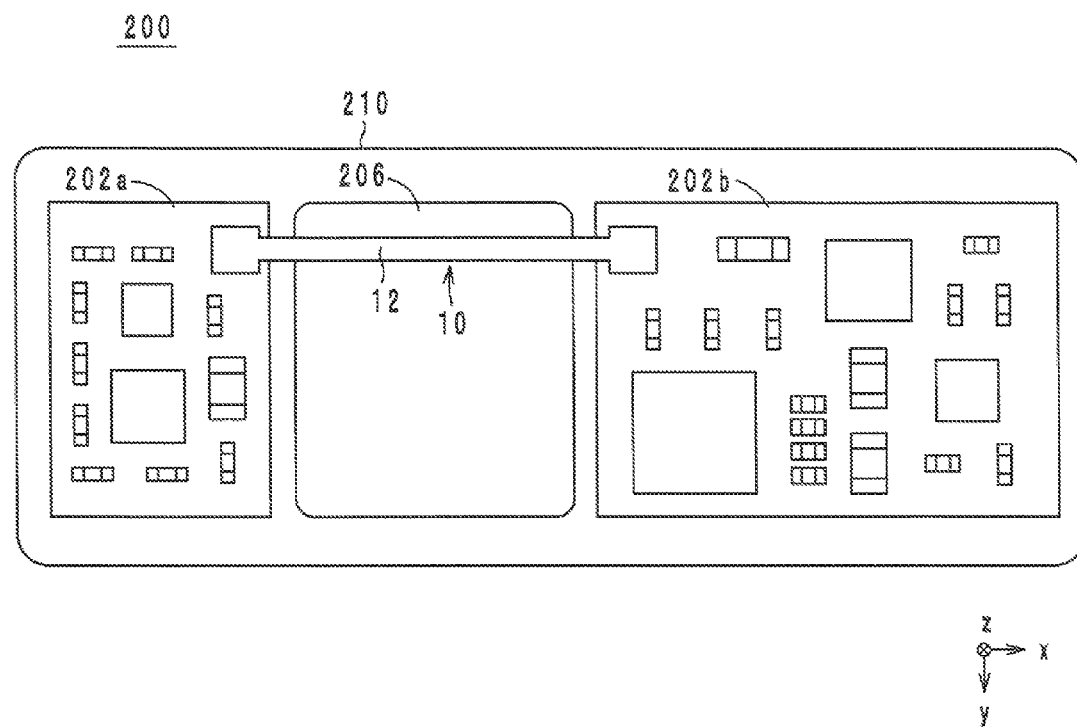
Figure 7:
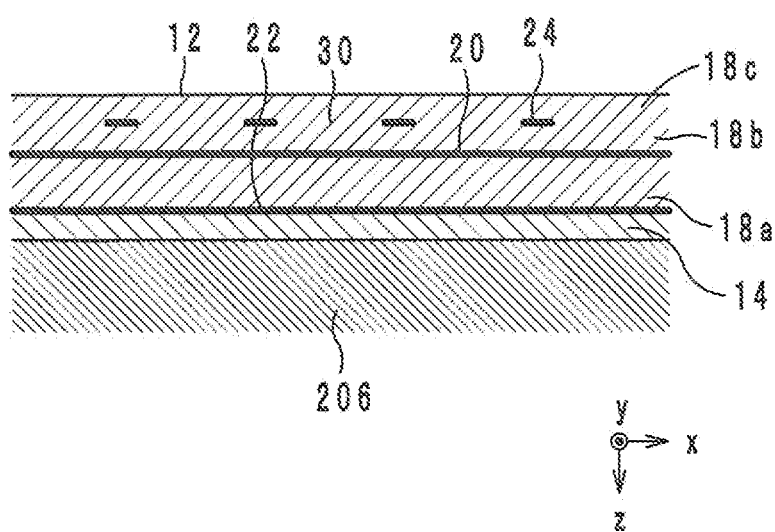
FIG. 7 is a cross-sectional view of a portion C illustrated in FIG. 6A.

The high-frequency signal transmission line 10 is preferably used as described below. FIGS. 6A and 6B are plan views of an electronic apparatus 200 including the high-frequency signal transmission line 10 from the y-axis and z-axis directions. FIG. 7 is a cross-sectional view of a portion C in FIG. 6A.

The electronic apparatus 200 preferably includes the high-frequency signal transmission line 10, circuit boards 202a and 202b, receptacles 204a and 204b, a battery pack (metal body) 206, and a casing 210.

At the circuit board 202a, for example, a transmission circuit or a receiving circuit including an antenna is disposed. At the circuit board 202b, for example, a feeding circuit is disposed. The battery pack 206 preferably is, for example, a lithium-ion secondary battery, and the surface of the battery pack 206 is covered with a metal cover. The circuit board 202a, the battery pack 206, and the circuit board 202b are arranged in this order from the negative x-axis direction to the positive x-axis direction.

The receptacles 204a and 204b are disposed on the main surfaces of the circuit boards 202a and 202b in the negative z-axis direction, respectively. The connectors 100a and 100b are connected to the receptacles 204a and 204b, respectively. As a result, a high-frequency signal having the frequency of, for example, 2 GHz transmitted between the circuit boards 202a and 202b is applied to the center conductors 108 of the connectors 100a and 100b via the receptacles 204a and 204b. The external conductors 110 of the connectors 100a and 100b are held at the ground potential via the circuit boards 202a and 202b and the receptacles 204a and 204b, respectively. As a result, the high-frequency signal transmission line 10 electrically and physically connects the circuit boards 202a and 202b.

As illustrated in FIG. 7, the surface of the dielectric body 12 (more accurately, the surface of the protection layer 14) is in contact with the battery pack 206. The surface of the dielectric body 12 and the battery pack 206 are bonded to each other preferably with an adhesive, for example. The surface of the dielectric body 12 is a main surface located on the side of the ground conductor 22 with respect to the signal line 20. Accordingly, between the signal line 20 and the battery pack 206, there is the ground conductor 22 that is a solid conductor and that continuously extends in the x-axis direction.

A non-limiting example of a manufacturing method of the high-frequency signal transmission line 10 will be described below with reference to FIG. 2. An exemplary case in which a single high-frequency signal transmission line 10 is created will be described. In reality, however, a plurality of high-frequency signal transmission lines 10 are preferably manufactured at the same time by laminating large dielectric sheets and cutting the laminate.

First, the dielectric sheets 18 that are made of a thermoplastic resin and include copper foil on the entire surfaces thereof are prepared. For example, the surface of the copper foil on the dielectric sheet 18 is subjected to galvanization for rustproofing, thereby being smoothed. The dielectric sheets 18 preferably have a thickness of about 20 µm to about 80 µm and are preferably made of liquid crystal polymer, for example. The copper foil preferably has a thickness of about 10 µm to about 20 µm, for example.

Subsequently, the external terminal 16 and the ground conductor 22 illustrated in FIG. 2 are formed on the surface of the dielectric sheet 18a by photolithography. More specifically, a resist having the same shape as each of the external terminal (16a and 16b) and the ground conductor 22 illustrated in FIG. 2 is printed on the copper foil on the dielectric sheet 18a. A portion of the copper foil which is not covered with the resist is removed by etching the portion of the copper foil. Subsequently, the resist is removed. As a result, the external terminal 16 and the ground conductor 22 illustrated in FIG. 2 are formed on the surface of the dielectric sheet 18a.

Subsequently, the signal line 20 illustrated in FIG. 2 is formed on the surface of the dielectric sheet 18b by photolithography. The ground conductor 24 illustrated in FIG. 2 is formed on the surface of the dielectric sheet 18c by photolithography. These photolithography processes are similar to the photolithography process of forming the external terminal 16 and the ground conductor 22, and the description thereof will be omitted.

Subsequently, a laser beam is applied from the undersurfaces of the dielectric sheets 18a and 18b to positions at which the via-hole conductors b1, b2, B1, and B2 are to be formed, so that through holes are formed. Subsequently, a conductive paste is charged into the through holes formed in the dielectric sheets 18a and 18b.

Subsequently, the dielectric sheets 18a to 18c are laminated in this order from the positive z-axis direction to the negative z-axis direction so that the ground conductor 22, the signal line 20, and the ground conductor 24 form a strip line structure. The dielectric sheets 18a to 18c are softened, pressbonded, and integrated and the conductive paste charged into the through holes are solidified by applying heat and pressure to the dielectric sheets 18a to 18c from the positive z-axis direction and the negative z-axis direction. As a result, the via-hole conductors b1, b2, B1, and B2 illustrated in FIG. 2 are formed. The dielectric sheets 18 are integrated by thermocompression bonding in the above-described example, but may be integrated with an adhesive such as an epoxy resin. The via-hole conductors b1, b2, B1, and B2 may be formed by integrating the dielectric sheets 18, forming through holes in the dielectric sheets 18, and charging conductive paste into the through holes or forming a plating film in the through holes.

Finally, the protection layer 14 is formed on the dielectric sheet 18a by applying a resin (resist) paste to the dielectric sheet 18a. Consequently, the high-frequency signal transmission line 10 illustrated in FIG. 1 is obtained.

In the high-frequency signal transmission line 10 having the above-described structure, a plurality of openings 30 are formed at the ground conductor 24. Accordingly, the high-frequency signal transmission line 10 can be easily bent.

With the high-frequency signal transmission line 10, the deviation of the characteristic impedance of the signal line from a predetermined characteristic impedance (for example, about 50 Ω) can be minimized. More specifically, in the flexible substrate disclosed in Japanese Unexamined Patent Application Publication No. 2007-123740, an electromagnetic field may exit from the opening portion of the flexible substrate. In a case where a dielectric or a metal body is disposed around the flexible substrate, electromagnetic field coupling occurs between the signal line in the flexible substrate and the dielectric or the metal body. As a result, the characteristic impedance of the signal line in the flexible substrate may deviate from a predetermined characteristic impedance.

On the other hand, in the high-frequency signal transmission line 10, the surface of the dielectric body 12 on the side of the ground conductor 22 with respect to the signal line 20 is in contact with the battery pack 206, and the surface of the dielectric body 12 on the side of the ground conductor 24 is a noncontact surface apart from an article (a metal body) such as a battery pack. That is, between the signal line 20 and the battery pack 206, the ground conductor 24 at which the openings 30 are provided are not present but the ground conductor 22 at which substantially no opening is provided is present. As a result, the occurrence of electromagnetic field coupling between the signal line 20 and the battery pack 206 is prevented. In the high-frequency signal transmission line 10, the deviation of the characteristic impedance of the signal line 20 from a predetermined characteristic impedance is therefore minimized. That is, even in a case where the clearance (space) between a mounted component and an electronic component in the casing of an electronic apparatus such as a communication terminal is narrow or the clearance (space) between the casing and each of these components is narrow, the high-frequency signal transmission line 10 can be disposed in the space so that the surface of the high-frequency signal transmission line 10 on the side of the ground conductor 22 is in contact with an article (a metal body). Accordingly, it is possible to reduce a characteristic change caused by the positional change of a high-frequency signal transmission line and obtain a high-frequency signal transmission line that is unaffected by the electronic component and the casing. In particular, in a case where a high-frequency signal transmission line is bonded to an article (a metal body) with an adhesive like the high-frequency signal transmission line 10, the characteristic change caused by the positional change can be reduced with more certainty.

For the following other reasons, the high-frequency signal transmission line 10 can be easily bent. A characteristic impedance Z of the high-frequency signal transmission line 10 is represented by $\sqrt{(L/C)}$ where L denotes an inductance value per unit length of the high-frequency signal transmission line 10 and C denotes a capacitance value per unit length of the high-frequency signal transmission line. The high-frequency signal transmission line 10 is designed so that Z becomes a predetermined characteristic impedance (for example, about 50 $\Omega$).

As a method of allowing the high-frequency signal transmission line 10 to be easily bent, a method of reducing the thickness of the high-frequency signal transmission line 10 in the z-axis direction (hereinafter merely referred to as a thickness) is considered. However, in a case where the thickness of the high-frequency signal transmission line 10 is reduced, the distance between the signal line 20 and each of the ground conductors 22 and 24 is reduced and the capacitance value C is increased. As a result, the characteristic impedance Z becomes smaller than the predetermined characteristic impedance.

Another method is considered for reducing the line width of the signal line 20 in the y-axis direction (hereinafter merely referred to as a line width) so as to increase the inductance value L of the signal line 20 and for reducing the area of the signal line 20 facing the ground conductors 22 and 24 so as to reduce the capacitance value C.

However, it is difficult to precisely form the signal line 20 having a small line width. In addition, the reduction in the line width of the signal line 20 increases a transmission loss and deteriorates an electrical characteristic.

Accordingly, in the high-frequency signal transmission line 10, the openings 30 are provided at the ground conductor 24. The area of the signal line 20 facing the ground conductor 24 is therefore reduced and the capacitance value C becomes smaller. As a result, it is possible to easily bend the high-frequency signal transmission line 10 while maintaining the characteristic impedance Z at a predetermined characteristic impedance.

In the high-frequency signal transmission line 10, the ground conductor 24 is disposed between the dielectric sheets 18b and 18c. The ground conductor 24 is not therefore exposed to the outside on the undersurface of the dielectric body 12. Accordingly, even in a case where another article is disposed on the undersurface of the dielectric body 12, the ground conductor 24 and the article do not directly face each other. This leads to the reduction in the change of the characteristic impedance of the signal line 20.

Figure 8:
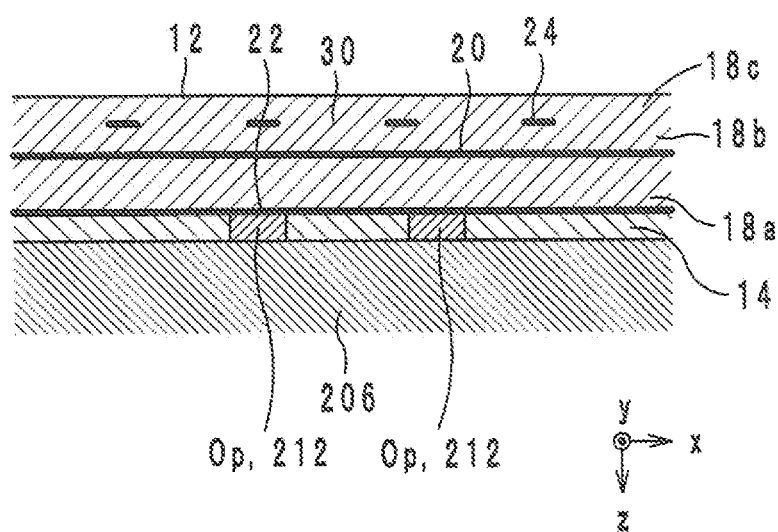
FIG. 8 is a cross-sectional view of a high-frequency signal transmission line and a battery pack to which the high-frequency signal transmission line is fixed with an installation method according to a first modification of the first preferred embodiment of the present invention.

A non-limiting example of an installation method according to a first modification of a preferred embodiment of the present invention will be described below. FIG. 8 is a cross-sectional view of the high-frequency signal transmission line 10 and the battery pack 206 to which the high-frequency signal transmission line 10 is fixed with an installation method according to the first preferred embodiment.

In a case where an installation method according to the first modification is used, the ground conductor 22 is electrically connected to the battery pack 206. More specifically, openings Op are provided at the protection layer 14. The ground conductor 22 is partly exposed to the outside via the openings Op provided at the protection layer 14. Solder or a conductive adhesive is charged into the openings Op, so that connection conductors 212 are formed. As a result, the ground conductor 24 is electrically connected to and fixed to the battery pack 206.

In the high-frequency signal transmission line 10 that has been installed with the above-described installation method, the ground conductors 22 and 24 are maintained at the ground potential not only via the terminal portions 22b and 22c but also via the battery pack 206 that is a metal article. Accordingly, the ground conductors 22 and 24 are more stably maintained at the ground potential. The metal article is not limited to a battery pack, and may be a printed circuit board (for example, a ground terminal) or a metal casing.

Next, a non-limiting example of an installation method according to a second modification of a preferred embodiment of the present invention will be described. FIG. 9 is a cross-sectional view of the high-frequency signal transmission line 10 and the battery pack 206 to which the high-frequency signal transmission line 10 is fixed with an installation method according to the second preferred embodiment.

With an installation method according to the second modification, the high-frequency signal transmission line 10 is bent along the surface of the battery pack 206 and is attached to the battery pack 206. Since the high-frequency signal transmission line 10 can be easily deformed, it can be bent along the battery pack 206.

Figure 10:
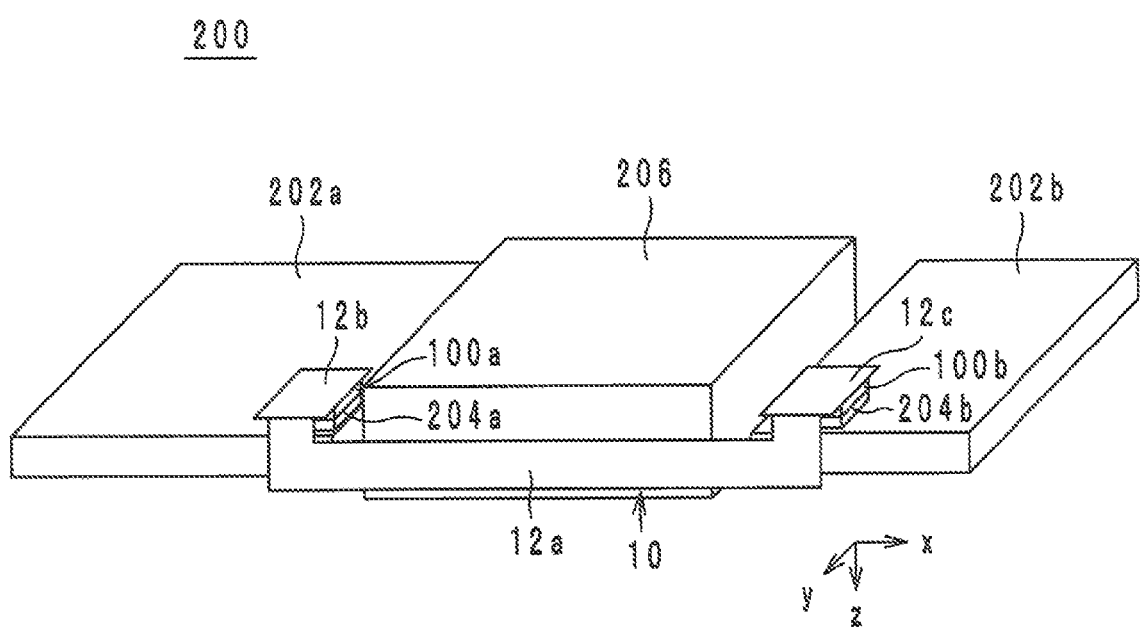
FIG. 10 is an external perspective view of the inside of an electronic apparatus in a case where an installation method according to a third modification of the first preferred embodiment of the present invention is used.

Next, a non-limiting example of an installation method according to a third modification of a preferred embodiment of the present invention will be described below. FIG. 10 is an external perspective view of the inside of the electronic apparatus 200 in a case where an installation method according to the third modification is used.

The high-frequency signal transmission line 10 illustrated in FIGS. 6A and 6B extends in the x-axis direction on the surface of the battery pack 206 in the negative z-axis direction without being bent.

On the other hand, the connection portions 12b and 12c of the high-frequency signal transmission line 10 illustrated in FIG. 10 are bent with respect to the line portion 12a. As a result, the high-frequency signal transmission line 10 extends in the x-axis direction on the side surface of the battery pack 206 in the positive y-axis direction. Since the high-frequency signal transmission line 10 can be easily bent, such arrangement can be easily achieved.

Figure 11:
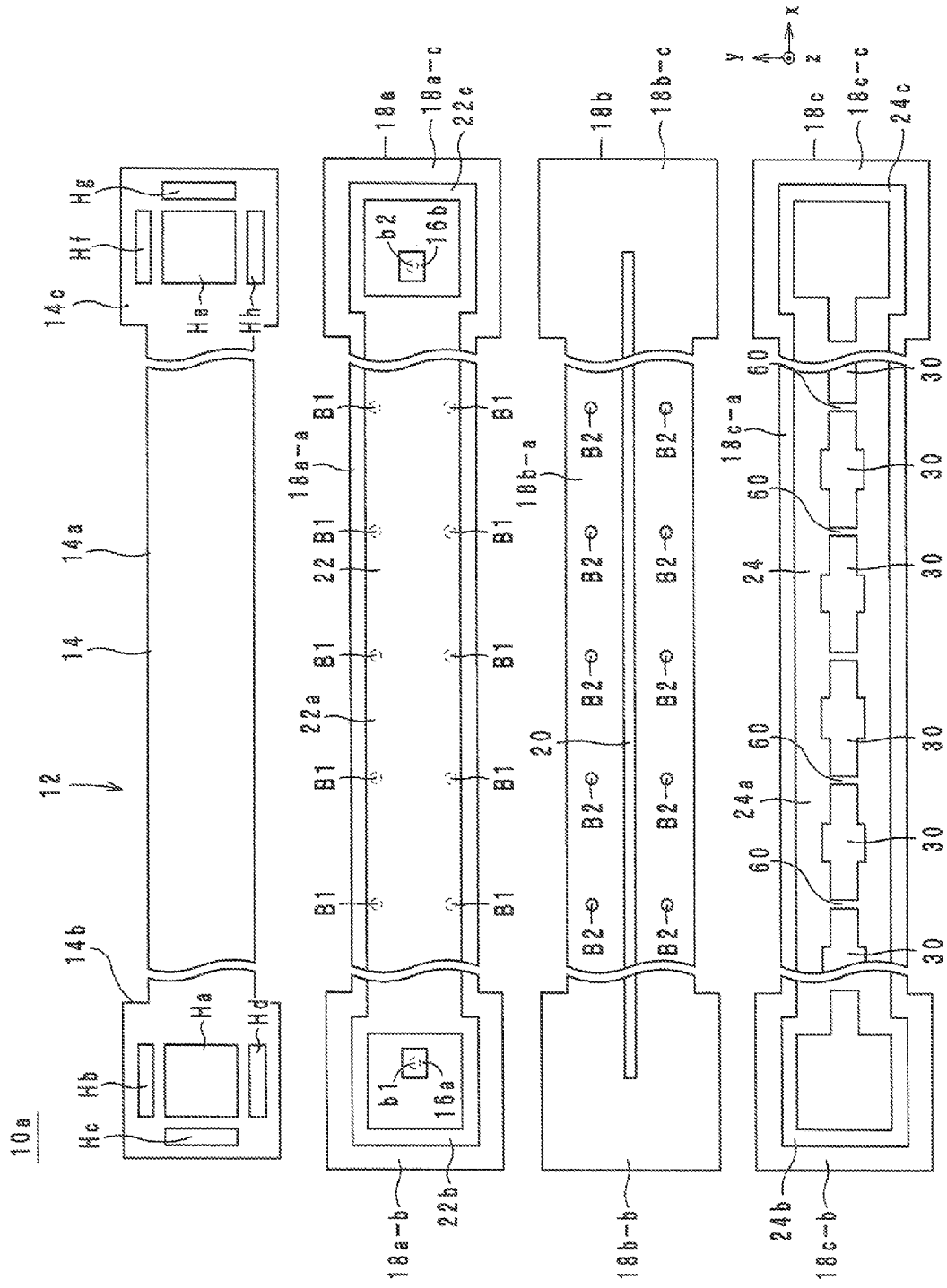
FIG. 11 is an exploded view of a laminate in a high-frequency signal transmission line according to the first modification of the first preferred embodiment of the present invention.
Figure 12:
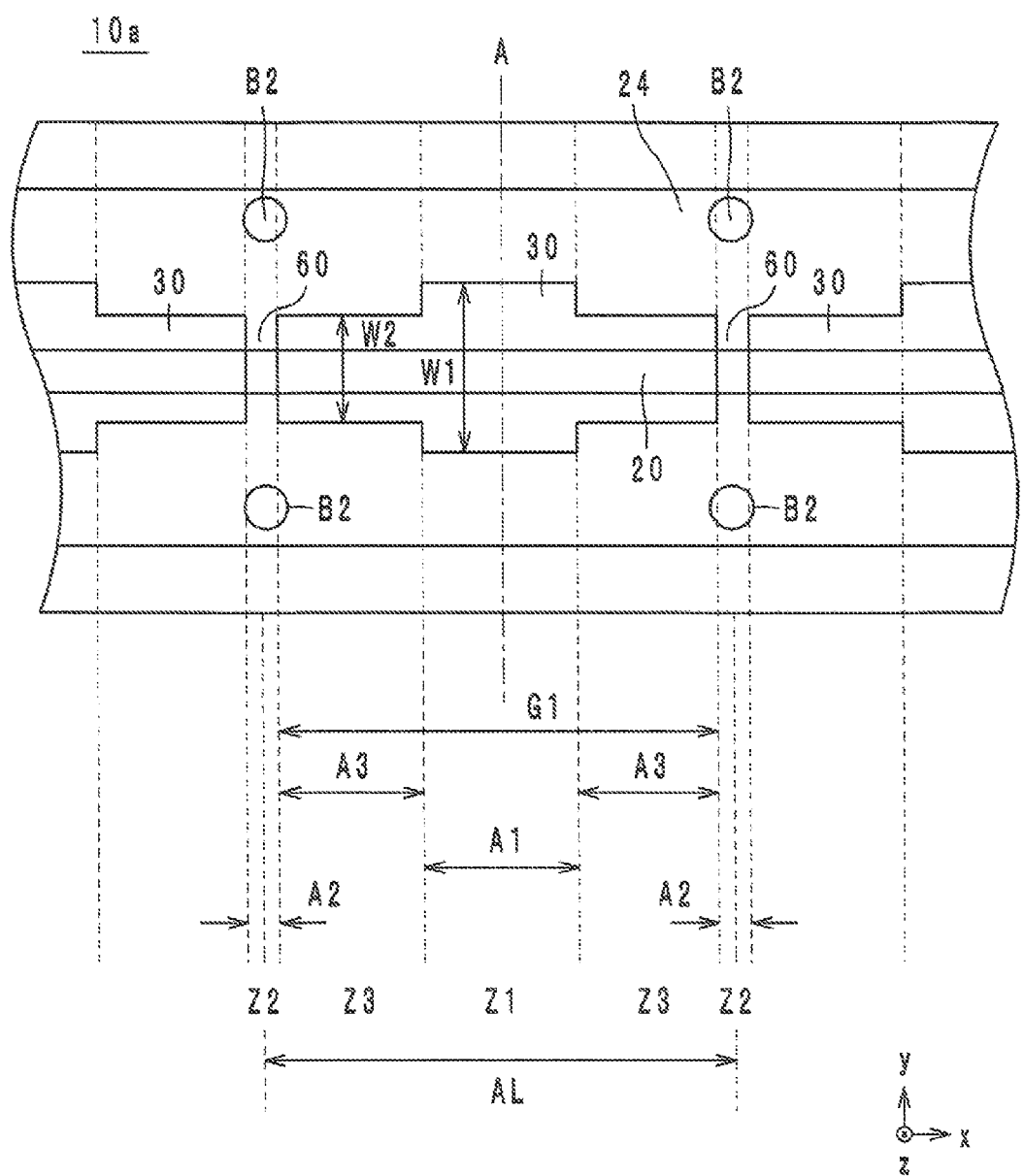
FIG. 12 is a perspective view of the high-frequency signal transmission line illustrated in FIG. 11 from the z-axis direction.
Figure 13:
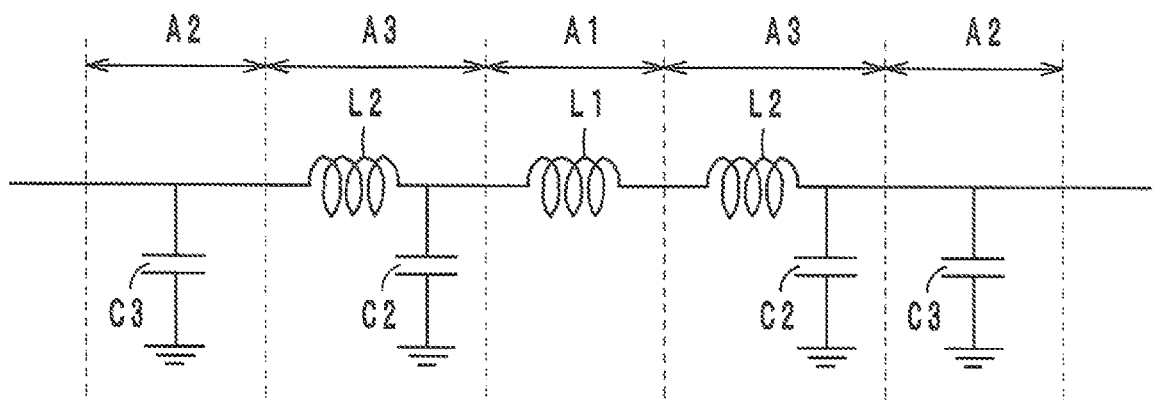
FIG. 13 is an equivalent circuit diagram of a portion of a high-frequency signal transmission line according to the first modification of the first preferred embodiment of the present invention.

The structure of a high-frequency signal transmission line according to the first modification of a preferred embodiment of the present invention will be described below with reference to the accompanying drawings. FIG. 11 is an exploded view of a laminate 12 in a high-frequency signal transmission line 10a according to the first modification. FIG. 12 is a perspective view of the high-frequency signal transmission line 10a illustrated in FIG. 11 from the z-axis direction. FIG. 13 is an equivalent circuit diagram of a portion of the high-frequency signal transmission line 10a according to the first modification.

The difference between the high-frequency signal transmission lines 10 and 10a is the shape of the openings 30. The structure of the high-frequency signal transmission line 10a will be described below, focusing on the difference.

The ground conductor 24 preferably has a ladder shape obtained by alternately disposing a plurality of openings 30 and a plurality of bridge portions 60 along the signal line 20. As illustrated in FIG. 12, the openings 30 overlap the signal line 20 in plan view from the z-axis direction, and are symmetric with respect to the signal line 20. That is, the signal line 20 traverses the midsections of the openings 30 in the y-axis direction.

In addition, each of the openings 30 is symmetric with respect to a line A that passes through the midsection of the opening 30 in a direction (the x-axis direction) in which the signal line 20 extends and is perpendicular or substantially perpendicular to the signal line 20 (that is, the line A extends in the y-axis direction). Detailed description will be provided below.

A region including the midsection of the opening 30 in the x-axis direction is defined as a region A1. A region corresponding to the bridge portion 60 is defined as a region A2. A region between the regions A1 and A2 is defined as a region A3. The region A3 is located on either side of the region A1 in the x-axis direction, and is adjacent to the regions A1 and A2. For example, the length of the region A2 in the x-axis direction (that is, the length of the bridge portion 60) is preferably in the range of about 25 μm to about 200 μm. In this preferred embodiment, the length of the region A2 in the x-axis direction preferably is about 100 μm, for example.

As illustrated in FIG. 12, the line A passes through the midsection of the region A1 in the x-axis direction. A width W1 of the opening 30 in the region A1 in a direction (the y-axis direction) perpendicular or substantially perpendicular to the signal line 20 is larger than a width W2 of the opening 30 in the region A3 in the y-axis direction. That is, the width of the opening 30 at the midsection thereof in the x-axis direction is larger than that of the other portion of the opening 30, and the opening 30 is symmetric with respect to the line A. The region A1 is a region in which the opening 30 has the width W1 in the y-axis direction, and the region A3 is a region in which the opening 30 has the width W2 in the y-axis direction. Accordingly, there is a step between the regions A1 and A3 of the opening 30. For example, the width W1 is preferably in the range of about 500 μm to about 1500 μm. In this preferred embodiment, the width W1 preferably is about 900 μm, for example. For example, the width W2 preferably is in the range of about 250 μm to about 750 μm. In this preferred embodiment, the width W2 preferably is about 480 μm, for example.

For example, a length G1 of the openings 30 in the x-axis direction preferably is in the range of about 1 mm to about 5 mm. In this preferred embodiment, the length G1 preferably is about 3 mm, for example. The length G1 is larger than the width W1 that is the maximum width of the openings 30. It is desired that the length G1 be about twice the width W1 or longer, for example.

At the ground conductor 24, no opening is provided between adjacent ones of the openings 30. More specifically, in the region A2 sandwiched between adjacent ones of the openings 30, a conductive layer (the bridge portion 60) uniformly extends and no opening is present.

In the high-frequency signal transmission line 10a having the above-described structure, the characteristic impedance of the signal line 20 changes such that, with increasing proximity to the other one of two adjacent bridge portions 60 from one of them, the characteristic impedance increases in the order of a minimum value Z2, an intermediate value Z3, and a maximum value Z1 and then decreases in the order of the maximum value Z1, the intermediate value Z3, and the minimum value Z2. More specifically, the opening 30 has the width W1 in the region A1 and the width W2 smaller than the width W1 in the region A3. Accordingly, the distance between the signal line 20 and the ground conductor 24 in the region A1 is larger than that in the region A3. As a result, the intensity of a magnetic field generated at the signal line 20 in the region A1 is higher than that of a magnetic field generated at the signal line 20 in the region A3, and an inductance component at the region A1 is increased. That is, in the region A1, an inductive component becomes dominant.

In the regions A2, the bridge portions 60 are provided. Accordingly, the distance between the signal line 20 and the ground conductor 24 in the region A3 is larger than that in the region A2. As a result, a capacitance generated at the signal line 20 in the region A2 is larger than that generated at the signal line 20 in the region A3, and the intensity of a magnetic field generated in the region A2 is lower than that of a magnetic field generated in the region A3. That is, in the region A2, a capacitive component becomes dominant.

Consequently, in the region A1, the characteristic impedance of the signal line 20 becomes the maximum value Z1. That is, at a position at which the characteristic impedance of the signal line 20 is the maximum value Z1, the opening 30 has the width W1. In the region A3, the characteristic impedance of the signal line 20 becomes the intermediate value Z3. That is, at a position at which the characteristic impedance of the signal line 20 is the intermediate value Z3, the opening 30 has the width W2. In the region A2, the characteristic impedance of the signal line 20 becomes the minimum value Z2.

The high-frequency signal transmission line 10 therefore has a circuit configuration illustrated in FIG. 13. More specifically, in the region A1, since substantially no capacitance is generated between the signal line 20 and the ground conductor 24, the characteristic impedance Z1 is generated mainly by the inductance L1 of the signal line 20. In the region A2, since a large capacitance C3 is generated between the signal line 20 and the ground conductor 24, the characteristic impedance Z2 is generated mainly by the capacitance C3. In the region A3, since a capacitance C2 smaller than the capacitance C3 is generated between the signal line 20 and the ground conductor 24, the characteristic impedance Z3 is generated by an inductance L2 of the signal line 20 and the capacitance C2. The characteristic impedance Z3 preferably is, for example, about 55 Ω. The characteristic impedance Z1 is higher than the characteristic impedance Z3, and preferably is, for example, about 70 Ω. The characteristic impedance Z2 is lower than the characteristic impedance Z3, and preferably is, for example, about 30 Ω. The overall characteristic impedance of the high-frequency signal transmission line 10 preferably is about 50 Ω, for example.

In the high-frequency signal transmission line 10a, the characteristic impedance of the signal line 20 changes such that, with increasing proximity to the other one of two adjacent bridge portions 60 from one of them, the characteristic impedance increases in the order of the minimum value Z2, the intermediate value Z3, and the maximum value Z1 and then decreases in the order of the maximum value Z1, the intermediate value Z3, and the minimum value Z2. Accordingly, the electrode width of the signal line 20 can be increased while reducing the profile of the high-frequency signal transmission line 10a. As a result, the surface area of electrode portions of the signal line 20 and the ground conductors 22 and 24 through which a high-frequency current flows can be increased and the transmission loss of a high-frequency signal is reduced. As illustrated in FIG. 12, since a length AL corresponding to one cycle (the region A1, the two regions A2, and the regions A3) preferably is a short length that falls within the range of about 1 mm to about 5 mm, the suppression of unnecessary radiation and the reduction in the transmission loss can be realized even in a higher-frequency range. Since the region A3 is placed on either side of the region A1, a strong magnetic field generated by a current passing through the signal line 20 is not directly transmitted to the region A2. As a result, the ground potential of the region A2 becomes stable and an effect of shielding by the ground conductor 24 is obtained. This leads to the significant reduction and prevention of unnecessary radiation. Consequently, in the high-frequency signal transmission line 10a, even in a case where the distance between the signal line 20 and each of the ground conductors 22 and 24 is reduced, the line width of the signal line 20 can be increased. It is therefore possible to reduce the profile of the high-frequency signal transmission line 10a and realize the reduction in the transmission loss and the significant reduction and prevention of unnecessary radiation while keeping the characteristic impedance of the high-frequency signal transmission line 10a. The high-frequency signal transmission line 10a can be therefore easily bent, and can be used after being bent.

In the high-frequency signal transmission line 10a, since the ground potential of the ground conductor 24 becomes stable, a transmission loss can be reduced. In addition, a shielding characteristic can be improved. More specifically, in the high-frequency signal transmission line 10a, the width W1 of the opening 30 in the region A1 is larger than the width W2 of the opening 30 in the region A3. Accordingly, in the high-frequency signal transmission line 10a, the magnetic energy of the signal line 20 in the region A1 is larger than that in the region A3. The magnetic energy of the signal line 20 in the region A2 is smaller than that in the region A3. The characteristic impedance of the signal line 20 is repeatedly changed in the order of Z2, Z3, Z1, Z3, Z2 . . . . The change in magnetic energy at adjacent portions of the signal line 20 in the x-axis direction is therefore slow. As a result, at the boundary between structural units (the regions A1 to A3), magnetic energy becomes small, the change in the ground potential of a ground conductor is reduced, and the significant reduction and prevention of unnecessary radiation and the reduction in the transmission loss of a high-frequency signal are realized.

That is, the region A3 can significantly reduce and prevent the generation of an unnecessary inductance component at the bridge portion 60. As a result, the mutual inductance component generated between the bridge portion 60 and the signal line 20 can be reduced and the ground potential can be stable. Thus, even in the low-profile high-frequency signal transmission line in which the relatively large openings 30 are provided at the ground conductor, unnecessary radiation can be significantly reduced and prevented and the transmission loss of a high-frequency signal can be reduced.

Since the via-hole conductors B1 are disposed in a direction in which the bridge portions 60 extend, the generation of an unnecessary inductance component at the bridge portions 60 can be significantly reduced and prevented. In particular, since the length G1 of the opening 30 in the x-axis direction (that is the distance between the bridge portions 60) is larger than the width W1 of the opening 30 in the region A1, the area of the opening 30 can be maximized. As a result, the occurrence of unnecessary radiation can be significantly reduced and prevented while obtaining a predetermined characteristic impedance.

The openings 30 are structural units disposed at regular intervals in a direction (the x-axis direction) in which the signal line 20 extends. Accordingly, the frequency characteristic of the characteristic impedance of the signal line 20 in the openings 30 can be determined in accordance with the length of the openings 30 in the x-axis direction. That is, as the length G1 of the openings 30 is reduced, the frequency characteristic of the characteristic impedance of the signal line can be extended to a higher-frequency range. With the increasing length G1 of the openings 30, the width W1 of the openings 30 in the region A1 can be reduced and the openings 30 can extend in a narrow strip form. Since the occurrence of unnecessary radiation can be significantly reduced and prevented and a transmission loss can be reduced, the stable impedance characteristic of the high-frequency signal transmission line 10a in a broader band can be achieved.

The high-frequency signal transmission line 10a can be used after being bent for the following reason. In the region A1, since the width of the openings 30 in the y-axis direction is the largest, the high-frequency signal transmission line 10 is most susceptible to bending. On the other hand, in the region A2, since no opening 30 is provided, it is hardly bent. In a case where the high-frequency signal transmission line 10a is used after being bent, it is bent in the region A1 and is hardly bent in the region A2. In the high-frequency signal transmission line 10a, the via-hole conductors B1 and B2, which are less deformable than the dielectric sheets 18, are therefore disposed in the region A2. As a result, the high-frequency signal transmission line 10a can be easily bent in the region A1.

In the high-frequency signal transmission line 10a, a predetermined characteristic impedance can also be obtained by adjusting the distance T1 between the signal line 20 and the ground conductor 22 and the distance T2 between the signal line 20 and the ground conductor 24.

In the high-frequency signal transmission line 10a, the length G1 of the openings 30 in a direction in which the signal line 20 extends is larger than the width W1 for the following reason. More specifically, a high-frequency signal transmission mode in the high-frequency signal transmission line 10 is a TEM mode. In the TEM mode, an electric field and a magnetic field are generated in a direction perpendicular or substantially perpendicular to a high-frequency signal transmission direction (the x-axis direction). That is, a magnetic field is generated in the form of circles around the signal line 20, and an electric field radially extends from the signal line 20 to the ground conductors 22 and 24. The magnetic field, which forms circles, is only deformed at the openings 30 provided at the ground conductor 22 so that the radii of the circles become larger. Accordingly, the magnetic field does not significantly leak from the high-frequency signal transmission line 10a. On the other hand, the electric field is partly emitted from the high-frequency signal transmission line 10a. Accordingly, the radiation of an electric field occupies a large portion of unnecessary radiation in the high-frequency signal transmission line 10a.

Since the electric field is perpendicular or substantially perpendicular to a high-frequency signal transmission direction (the x-axis direction), the increase in the width W1 of the opening 30 in the y-axis direction increases the amount of electric field emitted from the opening 30 (the amount of unnecessary radiation). On the other hand, the larger the width W1, the higher the characteristic impedance of the high-frequency signal transmission line 10a. However, since there is no electric field at a distance of approximately three times the line width of the signal line 20 from the signal line 20 in a direction perpendicular or substantially perpendicular to the high-frequency signal transmission direction (x-axis direction) in the high-frequency signal transmission line 10a, the further increase in the width W1 cannot increase the characteristic impedance. Accordingly, excessive increase in the width W1 is undesirable in consideration of the fact that the amount of unnecessary radiation is increased as the width W1 increases. In addition, in a case where the width W1 reaches approximately half the wavelength of a high-frequency signal, a slot antenna is formed, an electromagnetic wave is emitted, and the amount of unnecessary radiation is increased.

On the other hand, the longer the length G1 of the opening 30 in the x-axis direction, the smaller the area of the signal line 20 facing the ground conductor 22. Accordingly, the line width of the signal line 20 can be increased. As a result, the high-frequency resistance value of the signal line 20 can be reduced.

In a case where the length G1 is larger than the width W1, the high-frequency resistance value of a counter current (eddy current) in the ground conductor 22 is small.

It is therefore desired that the length G1 be larger than the width W1, and, be preferably twice the width W1 or longer. At that time, in consideration of the fact that a slot antenna is formed and an electromagnetic wave is emitted from the opening 30 in a case where the length G1 of the opening 30 in the x-axis direction reaches approximately half the wavelength of a high-frequency signal, the length G1 is preferably much shorter than the wavelength.

Figure 14:
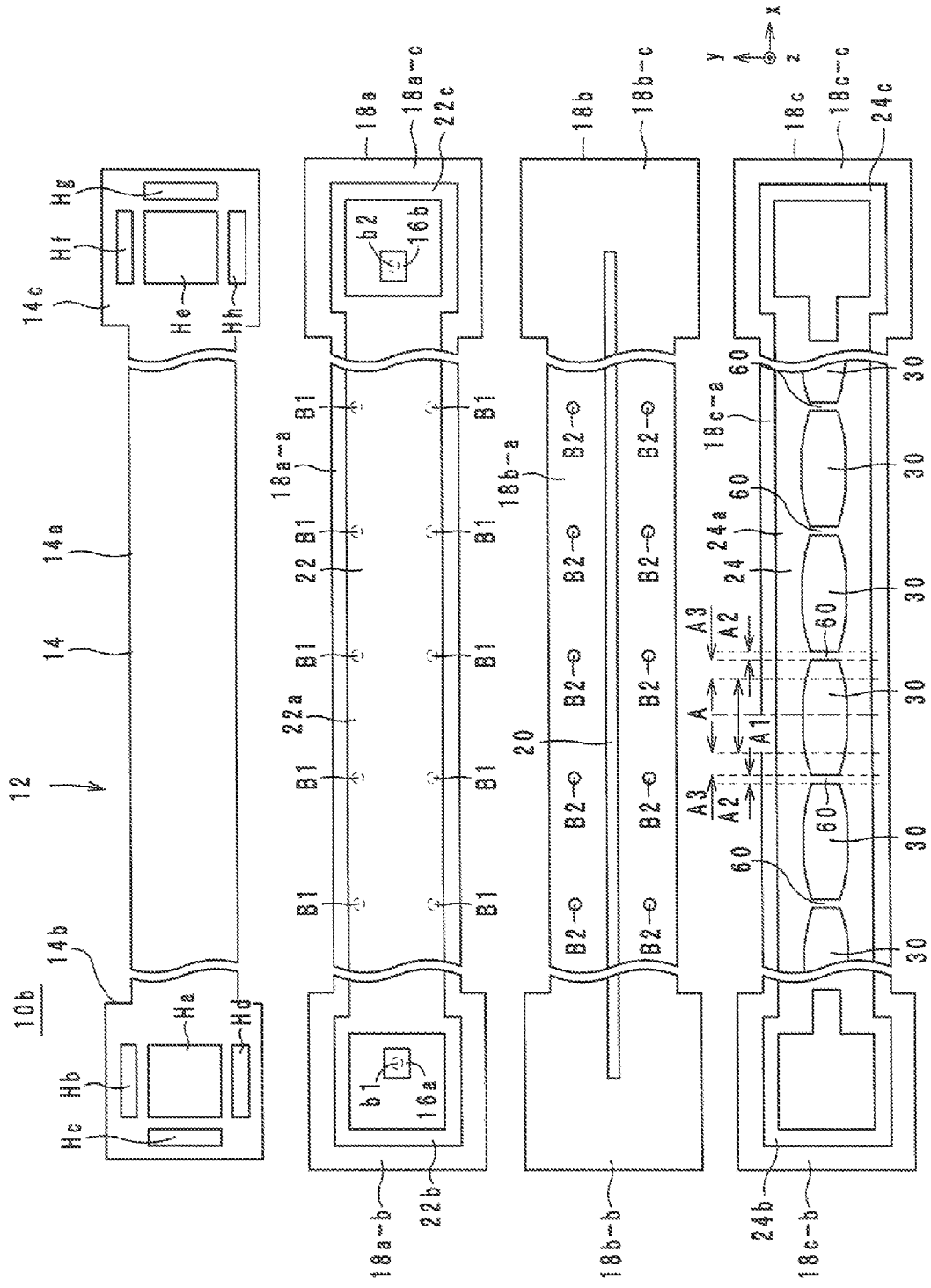
FIG. 14 is an exploded view of a laminate in a high-frequency signal transmission line according to the second modification of the first preferred embodiment of the present invention.

A high-frequency signal transmission line according to the second modification of a preferred embodiment of the present invention will be described below with reference to the accompanying drawing. FIG. 14 is an exploded view of the laminate 12 in a high-frequency signal transmission line 10b according to the second modification.

The difference between the high-frequency signal transmission lines 10b and 10a is the shape of the openings 30. More specifically, as illustrated in FIG. 11, the width of the openings 30 of the high-frequency signal transmission line 10a in the y-axis direction is discontinuously changed in a stepwise manner. In contrast, the width of the openings 30 of the high-frequency signal transmission line 10b in the y-axis direction is continuously changed. More specifically, the width of the opening 30 in the y-axis direction is continuously reduced as the distance from the center of the opening 30 in the x-axis direction increases. As a result, the magnetic energy and characteristic impedance of the signal line 20 are continuously changed.

As illustrated in FIG. 14, in the high-frequency signal transmission line 10b, the region A1 has the line A as the center line and includes a portion of the opening 30 having the width W1 in the y-axis direction. Accordingly, in the region A1, the characteristic impedance of the signal line 20 becomes the maximum value Z1. The region A2 is provided between the openings and includes the bridge portion 60. Accordingly, in the region A2, the characteristic impedance of the signal line 20 becomes the minimum value Z2. The region A3 is sandwiched between the regions A1 and A2, and includes a portion of the opening 30 having the width W2 in the y-axis direction. Accordingly, in the region A3, the characteristic impedance of the signal line 20 becomes the intermediate value Z3.

The region A1 needs to include only the portion of the opening 30 having the width W1 in the y-axis direction, and the region A3 needs to include only the portion of the opening 30 having the width W2 in the y-axis direction. Accordingly, in the present preferred embodiment, the boundary between the regions A1 and A3 is not clearly defined. For example, the boundary between the regions A1 and A3 is a position at which the width of the opening 30 in the y-axis direction is (W1+W2)/2.

Like the high-frequency signal transmission line 10, the high-frequency signal transmission line 10b having the above-described structure can be used after being bent, can significantly reduce and prevent the occurrence of unnecessary radiation, and can significantly reduce and prevent a transmission loss in the signal line 20.

Figure 15:
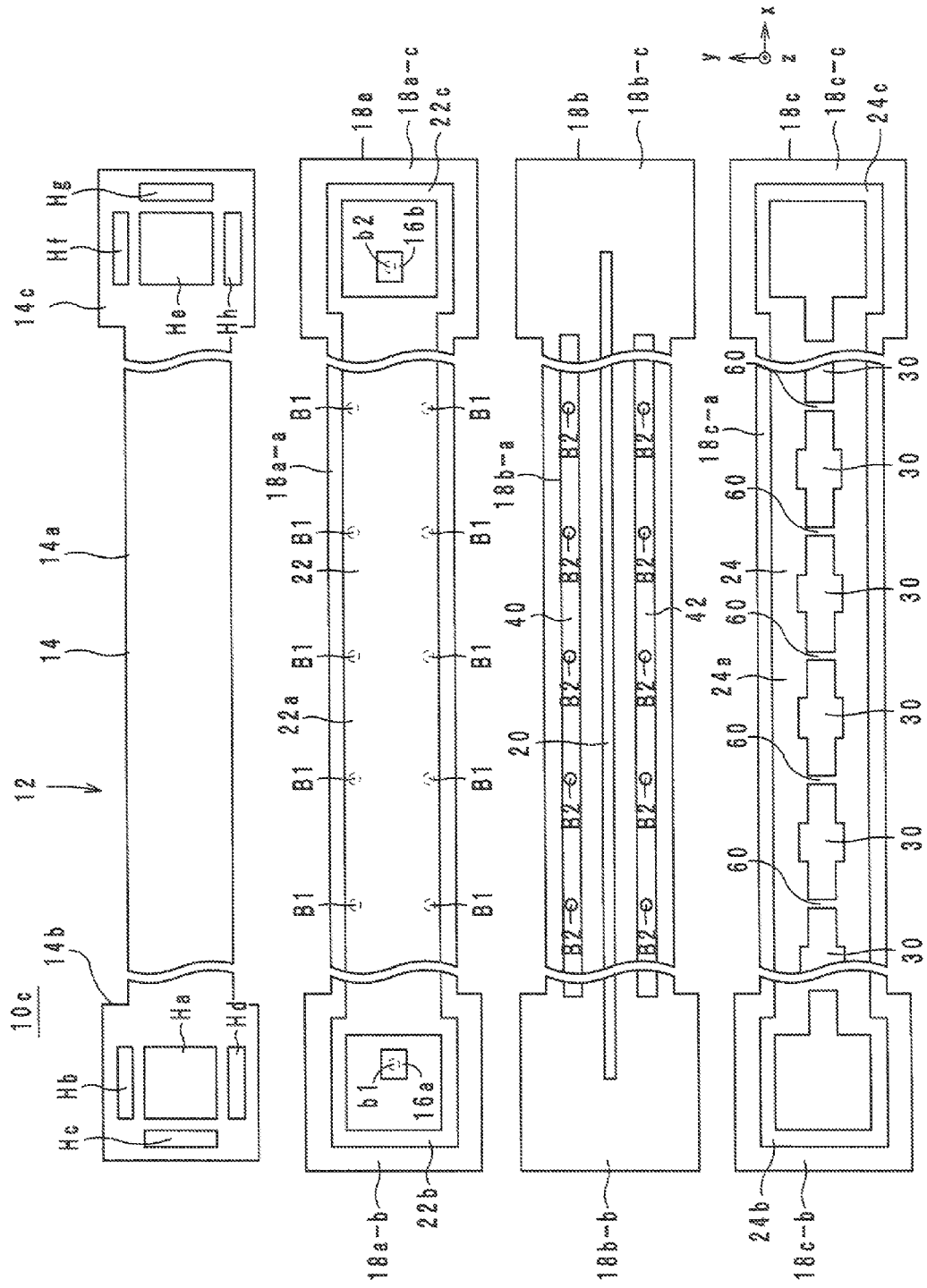
FIG. 15 is an exploded view of a laminate in a high-frequency signal transmission line according to the third modification of the first preferred embodiment of the present invention.

A high-frequency signal transmission line according to the third modification of a preferred embodiment of the present invention will be described below with reference to the accompanying drawing. FIG. 15 is an exploded view of the laminate 12 in a high-frequency signal transmission line 10c according to the third modification.

The difference between the high-frequency signal transmission lines 10c and 10a is the presence of ground conductors 40 and 42. More specifically, in the high-frequency signal transmission line 10c, the ground conductors 40 and 42 are disposed on the surface of the dielectric sheet 18b. The ground conductor 40 preferably is a rectangular or substantially rectangular conductor that is present in the positive y-axis direction with respect to the signal line 20 and extends in the x-axis direction. The ground conductor 40 is connected to the ground conductors 22 and 24 via the via-hole conductors B1 and B2, respectively. The ground conductor 42 preferably is a rectangular or substantially rectangular conductor that is present in the negative y-axis direction with respect to the signal line 20 and extends in the x-axis direction. The ground conductor 42 is connected to the ground conductors 22 and 24 via the via-hole conductors B1 and B2, respectively.

In the high-frequency signal transmission line 10c, since the ground conductors 40 and 42 are individually disposed on both sides of the signal line 20 in the y-axis direction, the occurrence of unnecessary radiation from the signal line 20 to both sides of the signal line 20 in the y-axis direction is significantly reduced and prevented.

Figure 16:
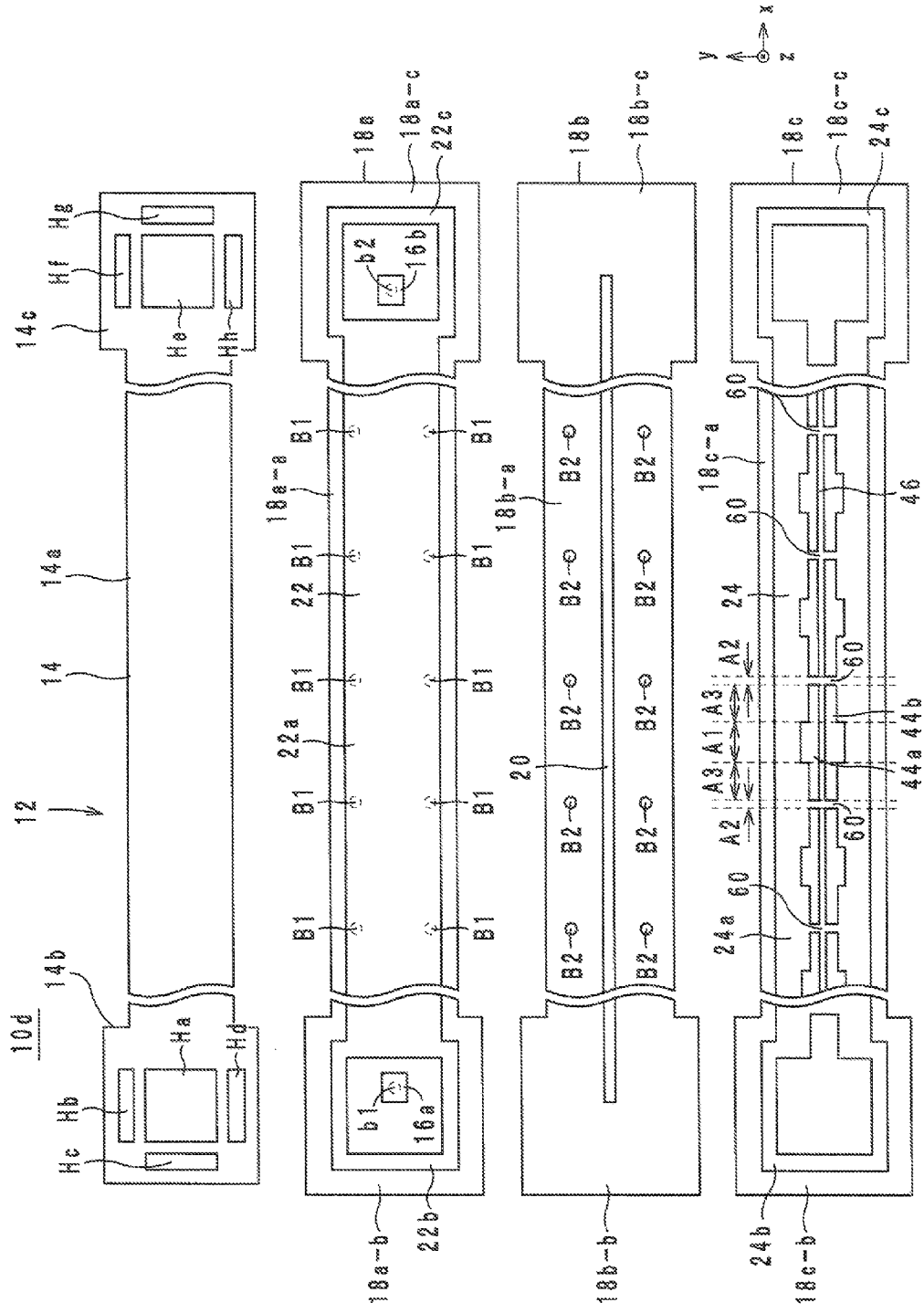
FIG. 16 is an exploded view of a laminate in a high-frequency signal transmission line according to a fourth modification of the first preferred embodiment of the present invention.

A high-frequency signal transmission line according to the fourth modification of a preferred embodiment of the present invention will be described below with reference to the accompanying drawing. FIG. 16 is an exploded view of the laminate 12 in a high-frequency signal transmission line 10d according to the fourth modification.

The difference between the high-frequency signal transmission lines 10d and 10a is the shape of openings (the openings 30 and openings 44a and 44b). More specifically, the openings 44a and 44b are obtained by dividing the opening 30 into two portions in the positive y-axis direction and the negative y-axis direction. In the high-frequency signal transmission line 10d, a linear conductor 46 extending in the x-axis direction is disposed between the openings 44a and 44b. The linear conductor is a portion of the ground conductor 24 and overlaps the signal line 20 in plan view from the z-axis direction.

In the high-frequency signal transmission line 10d, a plurality of openings 44a are arranged along the signal line 20, and a plurality of openings 44b are arranged along the signal line 20. As a result, in the region A1, the characteristic impedance of the signal line 20 becomes the maximum value Z1. In the region A3, the characteristic impedance of the signal line 20 becomes the intermediate value Z3. In the region A2, the characteristic impedance of the signal line 20 becomes the minimum value Z2.

In the high-frequency signal transmission line 10d, as illustrated in FIG. 16, the line width of the linear conductor 46 is smaller than that of the signal line 20. Accordingly, the signal line 20 protrudes from the linear conductor 46 in plan view from the z-axis direction. The line width of the linear conductor 46 may be larger than that of the signal line 20, and the signal line 20 does not necessarily have to protrude from the linear conductor 46. That is, the openings 44a and 44b do not necessarily have to overlap the signal line 20. Similarly, the openings 30 do not necessarily have to overlap the signal line 20. In the high-frequency signal transmission line 10d, the direction of high-frequency currents flowing through the linear conductor 46 and the ground conductors 22 and 24 is opposite to that of a high-frequency current flowing through the signal line 20. Accordingly, even in a case where the signal line 20 protrudes from the linear conductor 46, the high-frequency signal transmission line 10d can more effectively reduce and prevent the occurrence of unnecessary radiation as compared with the high-frequency signal transmission line 10.

Figure 17:
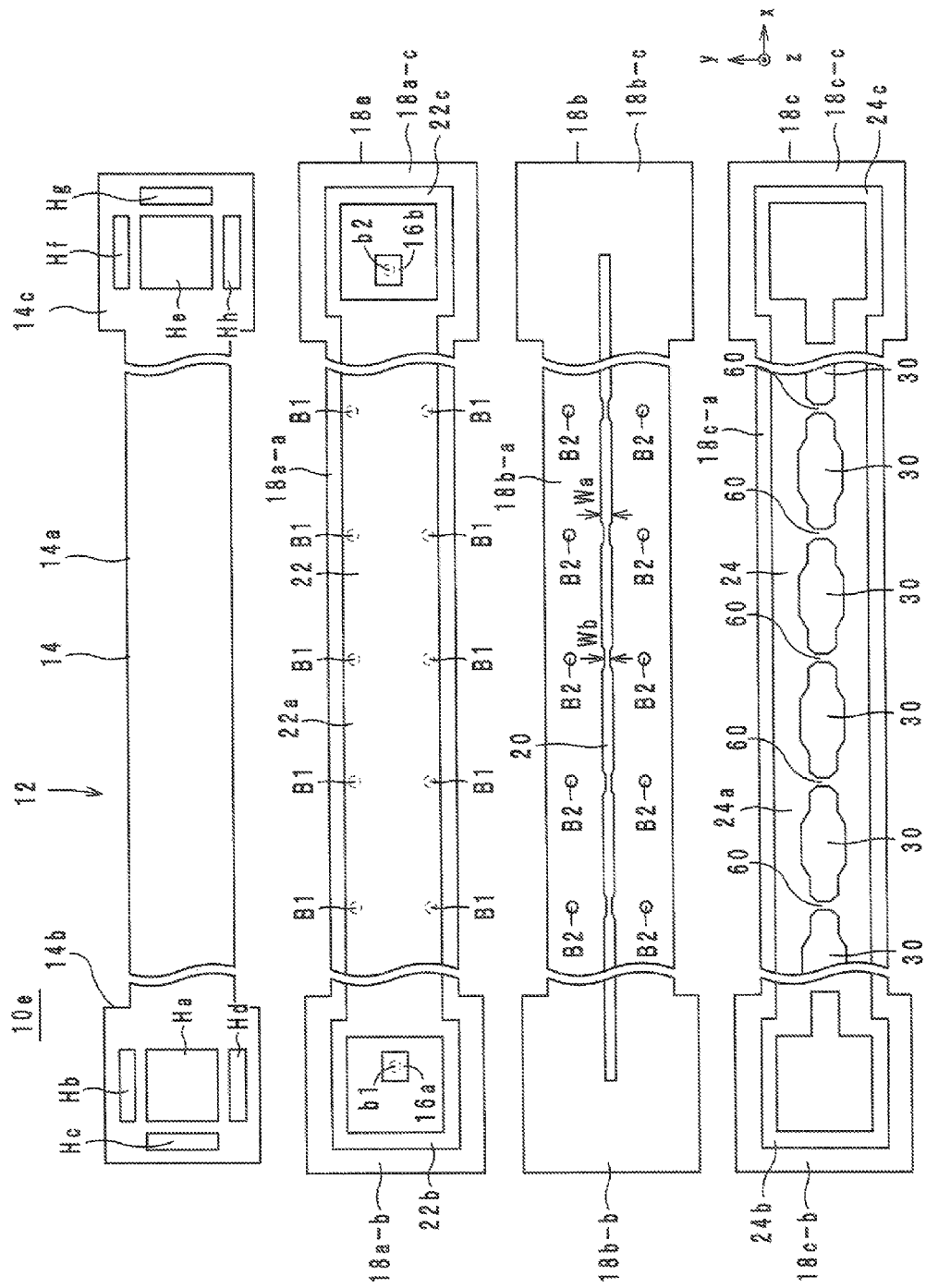
FIG. 17 is an exploded view of a laminate in a high-frequency signal transmission line according to a fifth modification of the first preferred embodiment of the present invention.

A high-frequency signal transmission line according to the sixth modification of a preferred embodiment of the present invention will be described below with reference to the accompanying drawings. FIG. 17 is an exploded view of the laminate 12 in a high-frequency signal transmission line 10e according to the fifth modification. FIG. 18 is a perspective view of the high-frequency signal transmission line 10e illustrated in FIG. 17 from the z-axis direction.

A first difference between the high-frequency signal transmission lines 10e and 10a is that the line width of the signal line 20 at the bridge portions 60 is smaller than that of the signal line 20 at positions at which the characteristic impedance of the signal line 20 becomes the maximum value Z1. A second difference between the high-frequency signal transmission lines 10e and 10a is that the opening 30 tapers between a position at which the characteristic impedance of the signal line 20 becomes the intermediate value Z3 (that is, the position at which the width W2 of the opening 30 in the y-axis direction is obtained) and a position at which the characteristic impedance of the signal line 20 becomes the maximum value Z1 (that is, the position at which the width W1 of the opening 30 in the y-axis direction is obtained). A third difference between the high-frequency signal transmission lines 10e and 10a is that the opening 30 tapers between a position at which the characteristic impedance of the signal line 20 becomes the intermediate value Z3 (that is, the position at which the width W2 of the opening 30 in the y-axis direction is obtained) and the bridge portion 60.

First, the definitions of the regions A1 to A3 in the high-frequency signal transmission line 10e will be described with reference to FIG. 18. The region A1 is a region in which the width W1 of the opening 30 in the y-axis direction is obtained. The region A2 is a region corresponding to the bridge portion 60. The region A3 is sandwiched between the regions A1 and A2, and includes a portion of the opening 30 having the width W2 in the y-axis direction.

The first difference will be described. As illustrated in FIGS. 17 and 18, the signal line 20 has a line width Wb in the region A2. The signal line 20 has a line width Wa larger than the line width Wb in the region A1. For example, the line width Wa is preferably in the range of about 100 μm to about 500 μm. In the present preferred embodiment, the line width Wa preferably is about 350 μm, for example. For example, the line width Wb preferably is in the range of about 25 μm to about 250 μm, for example. In the present preferred embodiment, the line width Wb preferably is about 100 μm, for example. Since the line width of the signal line 20 in the region A2 is smaller than that in the region A1, the area of a portion of the signal line 20 overlapping the bridge portion 60 is reduced. As a result, a stray capacitance generated between the signal line 20 and the bridge portion 60 is reduced. Furthermore, since a portion of the signal line 20 overlapping the opening 30 has the line width Wa, the increase in the inductance value of the portion of the signal line 20 can be significantly reduced and prevented. Still furthermore, since the line width of the signal line 20 is not wholly narrowed but partly narrowed, the increase in the resistance value of the signal line 20 is significantly reduced and prevented.

The signal line 20 tapers with the change in the line width thereof. As a result, at a portion of the signal line 20 whose line width varies, the change in a resistance value becomes slow and the occurrence of the reflection of a high-frequency signal is significantly reduced and prevented.

The second difference will be described. The opening tapers between the position at which the width W2 of the opening 30 in the y-axis direction is obtained and the position at which the width W1 of the opening 30 in the y-axis direction is obtained. That is, the end portion of the region A3 in the x-axis direction tapers. As a result, the loss of a current passing through the ground conductor 24 is reduced.

The third difference will be described. The opening 30 tapers between the position at which the width W2 of the opening 30 in the y-axis direction is obtained and the bridge portion 60. That is, both end portions of the bridge portion 60 in the y-axis direction taper. A portion of the bridge portion 60 overlapping the signal line 20 therefore has a line width smaller than that of the other portion of the bridge portion 60 in the x-axis direction. As a result, a stray capacitance generated between the bridge portion 60 and the signal line 20 is reduced. Since the line width of the bridge portion 60 is not wholly narrowed but partly narrowed, the increases in the resistance value and inductance value of the bridge portion 60 are significantly reduced and prevented.

A high-frequency signal transmission line according to the sixth modification of a preferred embodiment of the present invention will be described below with reference to the accompanying drawings. FIG. 19 is an exploded view of the laminate 12 in a high-frequency signal transmission line 10f according to the sixth modification. FIG. 20 is a perspective view of the high-frequency signal transmission line 10f illustrated in FIG. 19 from the z-axis direction.

The difference between the high-frequency signal transmission lines 10f and 10a is that a floating conductor 50 is disposed. More specifically, the high-frequency signal transmission line 10f further includes a dielectric sheet 18d and the floating conductor 50. The dielectric sheet 18d is located on the surface of the dielectric sheet 18c in the negative z-axis direction.

As illustrated in FIGS. 19 and 20, the floating conductor 50 preferably is a rectangular or substantially rectangular conductive layer and is disposed on the surface of the dielectric sheet 18d. The floating conductor 50 is located on the opposite side of the ground conductor 24 respect to the signal line 20.

The floating conductor 50 faces the signal line 20 and the ground conductor 24 in plan view from the z-axis direction. A width W3 of the floating conductor 50 in the y-axis direction is smaller than the width W1 of the opening 30 in the region A1 and is larger than the width W2 of the opening 30 in the region A3. The bridge portions 60 are covered with the floating conductor 50.

The floating conductor 50 is not electrically connected to conductive layers such as the signal line 20 and the ground conductor 24, and provides a floating potential. The floating potential is a potential between the signal line 20 and the ground conductor 24.

In the high-frequency signal transmission line 10f in which the floating conductor 50 faces the signal line 20, even in a case where a stray capacitance is generated between the signal line 20 and the floating conductor 50, the characteristic impedance of the signal line 20 is hardly changed. More specifically, since the floating conductor 50 is not electrically connected to the signal line 20 and the ground conductors 22 and 24, the floating conductor 50 provides a floating potential. Accordingly, the stray capacitance between the signal line 20 and the floating conductor 50 and the stray capacitance between the floating conductor 50 and the ground conductor 24 are serially connected to each other.

The width W3 of the floating conductor 50 is smaller than the width W1 of the opening 30 in the region A1 and is larger than the width W2 of the opening 30 in the region A3. Accordingly, the area of a portion of the floating conductor 50 facing the ground conductor 24 is small, and the stray capacitance between the ground conductor 24 and the floating conductor 50 is also small. A capacitance obtained by combining the stray capacitance between the signal line 20 and the floating conductor 50 and the stray capacitance between the floating conductor 50 and the ground conductor 24, which are serially connected to each other, is therefore small. With the floating conductor 50, the amount of change in the characteristic impedance of the signal line 20 becomes small.

Second Preferred Embodiment

A high-frequency signal transmission line and an electronic apparatus according to the second preferred embodiment of the present invention will be described below with reference to the accompanying drawings.

Figure 21:
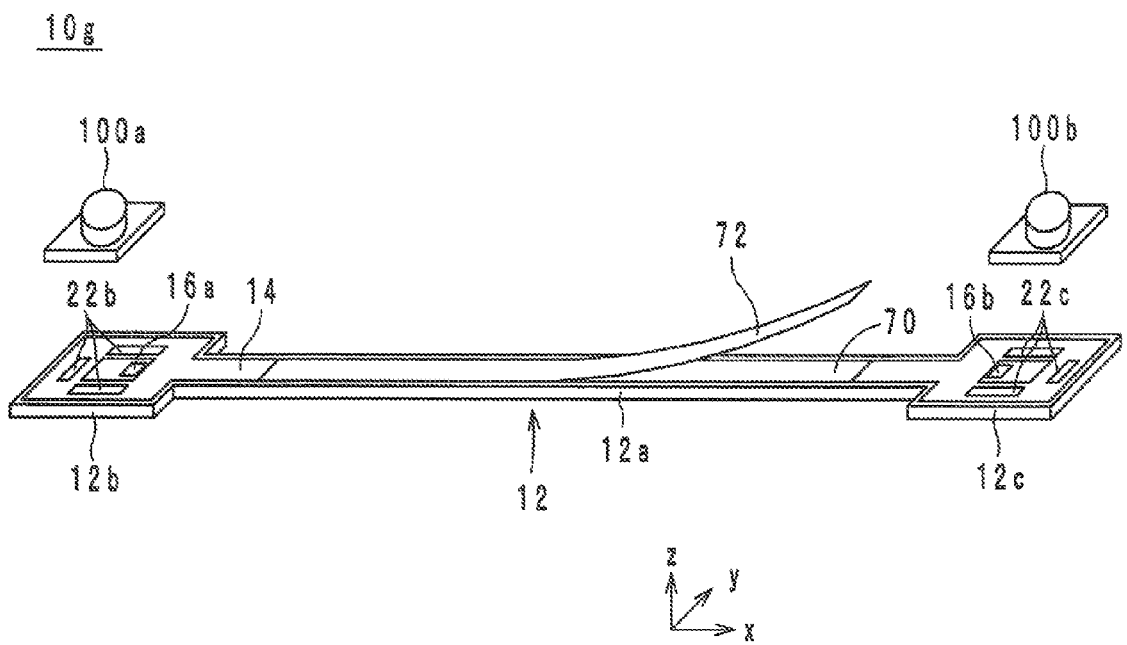
FIG. 21 is an external perspective view of a high-frequency signal transmission line according to a second preferred embodiment of the present invention of the present invention.
Figure 23:
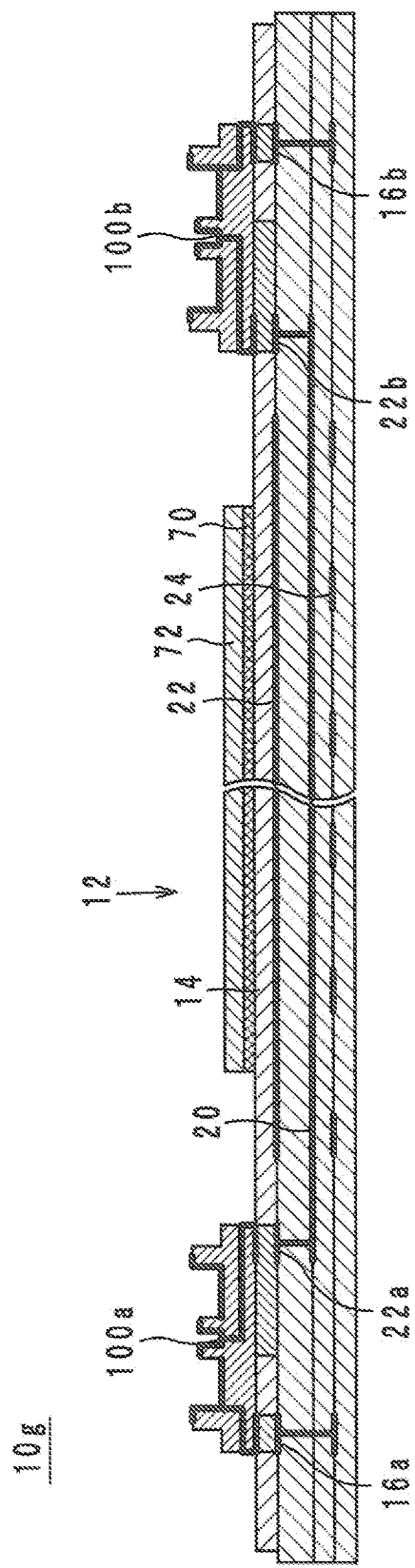
FIG. 23 is a cross-sectional view of the high-frequency signal transmission line illustrated in FIG. 21.
Figure 24:
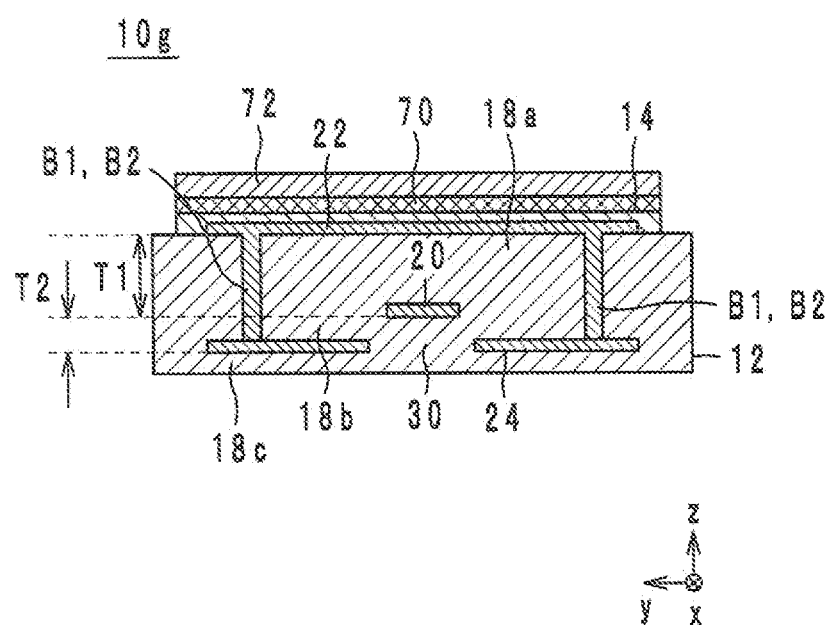
FIG. 24 is a cross-sectional view of a high-frequency signal transmission line.

The structure of a high-frequency signal transmission line according to the second preferred embodiment of the present invention will be described below with reference to the accompanying drawings. FIG. 21 is an external perspective view of a high-frequency signal transmission line 10g according to the second preferred embodiment of the present invention. FIG. 22 is an exploded view of the dielectric body 12 in the high-frequency signal transmission line 10g illustrated in FIG. 21. FIG. 23 is a cross-sectional view of the high-frequency signal transmission line 10g illustrated in FIG. 21. FIG. 24 is a cross-sectional view of the high-frequency signal transmission line 10g. Referring to FIGS. 21 to 24, a lamination direction in the high-frequency signal transmission line 10g is defined as a z-axis direction, a longitudinal direction in the high-frequency signal transmission line 10g is defined as an x-axis direction, and a direction orthogonal to the x-axis direction and the z-axis direction is defined as a y-axis direction.

For example, the high-frequency signal transmission line 10g is preferably used to connect two high-frequency circuits in an electronic apparatus such as a mobile telephone. As illustrated in FIGS. 21 to 23, the high-frequency signal transmission line 10g includes the dielectric body 12, the external terminal 16 (16a and 16b), the signal line 20, the ground conductors 22 and 24, an adhesive layer 70, a cover sheet 72, the via-hole conductors b1, b2, B1, and B2, and the connectors 100a and 100b.

As illustrated in FIG. 21, the dielectric body 12 extends in the x-axis direction in plan view from the z-axis direction, and includes the line portion 12a and the connection portions 12b and 12c. The dielectric body 12 is a laminate obtained by laminating the protection layer 14 and the dielectric sheets (insulating layers) 18 (18a to 18c), which are illustrated in FIG. 22, in this order from the positive z-axis direction to the negative z-axis direction. The dielectric body 12 has flexibility, and includes two main surfaces. In the following description, the main surface of the dielectric body 12 in the positive z-axis direction is referred to as a surface (the first main surface) and the main surface of the dielectric body 12 in the negative z-axis direction is referred to as an undersurface (the second main surface).

The line portion 12a extends in the x-axis direction. The connection portion 12b is connected to the end of the line portion 12a in the negative x-axis direction, and the connection portion 12c is connected to the end of the line portion 12a in the positive x-axis direction. The connection portions 12b and 12c preferably are rectangular or substantially rectangular in shape. The width of the connection portions 12b and 12c in the y-axis direction is larger than that of the line portion 12a in the y-axis direction.

The dielectric sheet 18 extends in the x-axis direction in plan view from the z-axis direction, and is an insulating layer having the same shape as the dielectric body 12. The dielectric sheet 18 is made of a thermoplastic resin such as polyimide or liquid crystal polymer having flexibility. As illustrated in FIG. 24, the thickness T1 of the dielectric sheet 18a is larger than the thickness T2 of the dielectric sheet 18b. For example, after the dielectric sheets 18a to 18c have been laminated, the thickness T1 preferably is in the range of about 50 μm to about 300 μm, for example. In the present preferred embodiment, the thickness T1 preferably is about 150 μm, for example. The thickness T2 is preferably in the range of about 10 μm to about 100 μm, for example. In the present preferred embodiment, the thickness T2 preferably is about 50 μm, for example. In the following description, the main surface of the dielectric sheet 18 in the positive z-axis direction is referred to as a surface, and the main surface of the dielectric sheet 18 in the negative z-axis direction is referred to as an undersurface.

The dielectric sheet 18a includes the line portion 18a-a and the connection portions 18a-b and 18a-c. The dielectric sheet 18b includes the line portion 18b-a and the connection portions 18b-b and 18b-c. The dielectric sheet 18c includes the line portion 18c-a and the connection portions 18c-b and 18c-c. The line portions 18a-a, 18b-a, and 18c-a define the line portion 12a. The connection portions 18a-b, 18b-b, and 18c-b define the connection portion 12b. The connection portions 18a-c, 18b-c, and 18c-c define the connection portion 12c.

As illustrated in FIGS. 21 and 22, the external terminal 16a preferably is a rectangular or substantially rectangular conductor disposed near the center of the surface of the connection portion 18*a*-*b*. As illustrated in FIGS. 21 and 22, the external terminal 16*b* preferably is a rectangular or substantially rectangular conductor disposed near the center of the surface of the connection portion 18*a*-*c*. The external terminals 16*a* and 16*b* are preferably made of a metal material such as silver or copper having low resistivity, for example. The surfaces of the external terminals 16*a* and 16*b* preferably are gold-plated.

As illustrated in FIG. 22, the signal line 20 is a linear conductor disposed in the dielectric body 12, and extends in the x-axis direction on the surface of the dielectric sheet 18*b*. Both ends of the signal line 20 individually overlap the external terminals 16*a* and 16*b* in plan view from the z-axis direction. For example, the line width of the signal line 20 preferably is in the range of about 100 μm to about 500 μm, for example. In the present preferred embodiment, the line width of the signal line 20 preferably is about 240 μm, for example. The signal line 20 is made of a metal material such as silver or copper having low resistivity.

As illustrated in FIG. 22, in the dielectric body 12, the ground conductor 22 (first ground conductor) is disposed between the signal line 20 and the first main surface (that is, in the positive z-axis direction with respect to the signal line 20), and, more specifically, is disposed on the surface of the dielectric sheet 18*a* nearest to the surface of the dielectric body 12. The ground conductor 22 extends in the x-axis direction on the surface of the dielectric sheet 18*a*, and faces the signal line 20 via the dielectric sheet 18*a*. No opening is disposed at a portion of the ground conductor 22 facing the signal line 20. That is, the ground conductor 22 is a solid electrode that continuously extends in the x-axis direction along the signal line 20 in the line portion 12*a*. The ground conductor 22 does not necessarily have to completely cover the line portion 12*a*. For example, in order to let gas caused by heat bonding of the dielectric sheet 18 made of a thermoplastic resin escape, a small hole may be provided at a predetermined position on the ground conductor 22. The ground conductor 22 is preferably made of a metal material such as silver or copper having low resistivity.

The ground conductor 22 includes the line portion 22*a* and the terminal portions 22*b* and 22*c*. The line portion 22*a* is disposed on the surface of the line portion 18*a*-*a*, and extends in the x-axis direction. The terminal portion 22*b* is disposed on the surface of the line portion 18*a*-*b*, and preferably is a rectangular or substantially rectangular ring surrounding the external terminal 16*a*. The terminal portion 22*b* is connected to the end of the line portion 22*a* in the negative x-axis direction. The terminal portion 22*c* is disposed on the surface of the line portion 18*a*-*c*, and preferably is a rectangular or substantially rectangular ring surrounding the external terminal 16*b*. The terminal portion 22*c* is connected to the end of the line portion 22*a* in the positive x-axis direction.

As illustrated in FIG. 22, in the dielectric body 12, the ground conductor 24 (second ground conductor) is disposed between the signal line 20 and the second main surface (that is, in the negative z-axis direction with respect to the signal line 20), and, more specifically, is disposed on the surface of the dielectric sheet 18*c*. The ground conductor 24 is therefore disposed between the dielectric sheets 18*b* and 18*c*. The ground conductor 24 extends in the x-axis direction on the surface of the dielectric sheet 18*c*, and faces the signal line 20 via the dielectric sheet 18*b*. That is, the ground conductor 24 faces the ground conductor 22 via the signal line 20 sandwiched therebetween. The ground conductor 24 preferably is made of a metal material such as silver or copper having low resistivity, for example.

The ground conductor 24 includes the line portion 24*a* and the terminal portions 24*b* and 24*c*. The line portion 24*a* is disposed on the surface of the line portion 18*c*-*a*, and extends in the x-axis direction. The line portion 24*a* has a ladder shape obtained by alternately disposing a plurality of openings 30 at which no conductive layer is provided and a plurality of bridge portions 60 at which a conductive layer is arranged along the signal line 20. As illustrated in FIGS. 22 and 24, the openings are preferably rectangular or substantially rectangular in shape and overlap the signal line 20 in plan view from the z-axis direction. Accordingly, the signal line 20 alternately overlaps the openings 30 and the bridge portions 60 in plan view from the z-axis direction. The openings 30 are arranged at regular intervals.

The terminal portion 24*b* is disposed on the surface of the line portion 18*c*-*b*, and preferably is a rectangular or substantially rectangular ring. The terminal portion 24*b* is connected to the end of the line portion 24*a* in the negative x-axis direction. The terminal portion 24*c* is disposed on the surface of the line portion 18*c*-*c*, and preferably is a rectangular or substantially rectangular ring. The terminal portion 24*c* is connected to the end of the line portion 24*a* in the positive x-axis direction.

As described previously, the signal line 20 is sandwiched between the ground conductors 22 and 24 via the dielectric layers 18*a* and 18*b*. That is, the signal line 20 and the ground conductors 22 and 24 define a triplate strip line structure. As illustrated in FIG. 24, the distance between the signal line 20 and the ground conductor 22 is substantially equal to the thickness T1 of the dielectric sheet 18*a*, and, for example, preferably is in the range of about 50 μm to about 300 μm. In the present preferred embodiment, the distance between the signal line 20 and the ground conductor 22 preferably is about 150 μm. On the other hand, as illustrated in FIG. 24, the distance between the signal line 20 and the ground conductor 24 is substantially equal to the thickness T2 of the dielectric sheet 18*b*, and, for example, preferably is in the range of about 10 μm to about 100 μm. In the present preferred embodiment, the distance between the signal line 20 and the ground conductor 24 preferably is about 50 μm, for example. That is, design is performed so that the thickness T1 is larger than the thickness T2.

The via-hole conductor b1 passes through the connection portion 18*a*-*b* of the dielectric sheet 18*a* in the z-axis direction, and connects the external terminal 16*a* and the end of the signal line 20 in the negative x-axis direction. The via-hole conductor b2 passes through the connection portion 18*a*-*c* of the dielectric sheet 18*a* in the z-axis direction, and connects the external terminal 16*b* and the end of the signal line 20 in the positive x-axis direction. As a result, the signal line 20 is connected between the external terminals 16*a* and 16*b*. The via-hole conductors b1 and b2 are preferably made of a metal material such as silver or copper having low resistivity, for example.

The via-hole conductors B1 pass through the line portion 18*a*-*a* of the dielectric sheet 18*a* in the z-axis direction, and are disposed at the line portion 18*a*-*a*. The via-hole conductors B2 pass through the line portion 18*b*-*a* of the dielectric sheet 18*b* in the z-axis direction, and are disposed at the line portion 18*b*-*a*. The via-hole conductor B1 and the via-hole conductor B2 are connected to each other, so that a single via-hole conductor is provided and connects the ground conductors 22 and 24. The via-hole conductors B1 and B2 are preferably made of a metal material such as silver or copper having low resistivity.

The protection layer 14 covers the substantially entire surface of the dielectric sheet 18*a*. As a result, the protection layer 14 covers the ground conductor 22. The protection layer 14 preferably is made of a flexible resin such as a resist material, for example.

As illustrated in FIG. 22, the protection layer 14 includes the line portion 14a and the connection portions 14b and 14c. The line portion 14a covers the entire surface of the line portion 18a-a, thereby covering the line portion 22a.

The connection portion 14b is connected to the end of the line portion 14a in the negative x-axis direction, and covers the surface of the connection portion 18a-b. At the connection portion 14b, the openings Ha to Hd are provided. The opening Ha preferably is a rectangular or substantially rectangular opening located at the center of the connection portion 14b. The external terminal 16a is exposed to the outside via the opening Ha. The opening Hb preferably is a rectangular or substantially rectangular opening arranged in the positive y-axis direction with respect to the opening Ha. The opening Hc preferably is a rectangular or substantially rectangular opening arranged in the negative x-axis direction with respect to the opening Ha. The opening Hd preferably is a rectangular or substantially rectangular opening arranged in the negative y-axis direction with respect to the opening Ha. The terminal portion 22b is exposed to the outside via the openings Hb to Hd so as to define and function as an external terminal.

The connection portion 14c is connected to the end of the line portion 14a in the positive x-axis direction, and covers the surface of the connection portion 18a-c. At the connection portion 14c, the openings He to Hh are provided. The opening He preferably is a rectangular or substantially rectangular opening located at the center of the connection portion 14c. The external terminal 16b is exposed to the outside via the opening He. The opening Hf preferably is a rectangular or substantially rectangular opening arranged in the positive y-axis direction with respect to the opening He. The opening Hg preferably is a rectangular or substantially rectangular opening arranged in the positive x-axis direction with respect to the opening He. The opening Hh preferably is a rectangular or substantially rectangular opening arranged in the negative y-axis direction with respect to the opening He. The terminal portion 22c is exposed to the outside via the openings Hf to Hh so as to define and function as an external terminal.

The adhesive layer 70 preferably is made of an insulating adhesive, and is located on the first main surface of the dielectric body 12. More specifically, the adhesive layer 70 is arranged so that it extends in the x-axis direction on the line portion 14a of the protection layer 14 in the dielectric body 12. The cover sheet 72 preferably is a flexible sheet that is releasably attached to the adhesive layer 70. For example, the adhesive layer 70 and the cover sheet 72 define an adhesive tape with a cover sheet thereon.

The connectors 100a and 100b are disposed on the surfaces of the connection portions 12b and 12c, respectively. The descriptions of the structures of the connectors 100a and 100b have been provided above, and will be therefore omitted.

Figure 25:
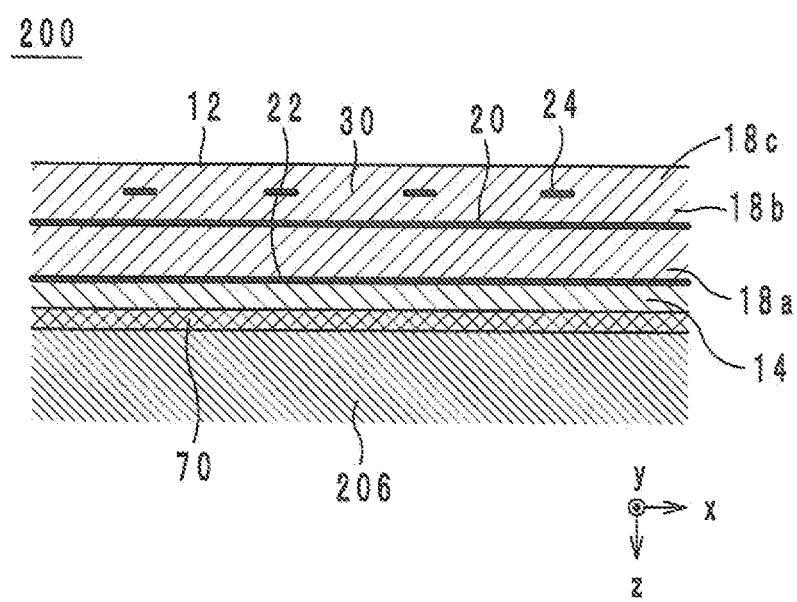
FIG. 25 is a cross-sectional view of an electronic apparatus 200.

The high-frequency signal transmission line 10g is preferably used as described below with reference to FIGS. 5A, 5B, 6A, 6B, and 25. FIG. 25 is a cross-sectional view of the electronic apparatus 200.

The electronic apparatus 200 preferably includes the high-frequency signal transmission line 10g, the circuit boards 202a and 202b, the receptacles 204a and 204b, the battery pack (article) 206, and the casing 210.

At the circuit board 202a, for example, a transmission circuit or a receiving circuit including an antenna is disposed. At the circuit board 202b, for example, a feeding circuit is disposed. The battery pack 206 is, for example, a lithium-ion secondary battery, and the surface of the battery pack 206 is covered with an insulator. The circuit board 202a, the battery pack 206, and the circuit board 202b are arranged in this order from the negative x-axis direction to the positive x-axis direction.

The receptacles 204a and 204b are disposed on the main surfaces of the circuit boards 202a and 202b in the negative z-axis direction, respectively. The connectors 100a and 100b are connected to the receptacles 204a and 204b, respectively. As a result, a high-frequency signal having the frequency of, for example, 2 GHz transmitted between the circuit boards 202a and 202b is applied to the center conductors 108 of the connectors 100a and 100b via the receptacles 204a and 204b. The external conductors 110 of the connectors 100a and 100b are held at the ground potential via the circuit boards 202a and 202b and the receptacles 204a and 204b, respectively. As a result, the high-frequency signal transmission line 10g electrically and physically connects the circuit boards 202a and 202b.

As illustrated in FIG. 25, the high-frequency signal transmission line 10g is fixed to the battery pack 206 via the adhesive layer 70 from which the cover sheet 72 has been detached. The surface of the dielectric body 12 is a main surface located on the side of the ground conductor 22 with respect to the signal line 20. Accordingly, between the signal line 20 and the battery pack 206, there is the ground conductor 22 that is a solid conductor (that continuously extends in the x-axis direction).

The high-frequency signal transmission line 10g preferably is bonded to the battery pack 206, but may be bonded to a printed circuit board or the casing of an electronic apparatus. The surface of the battery pack 206 preferably is covered with an insulator, but may be covered with a conductor such as metal.

Figure 26:
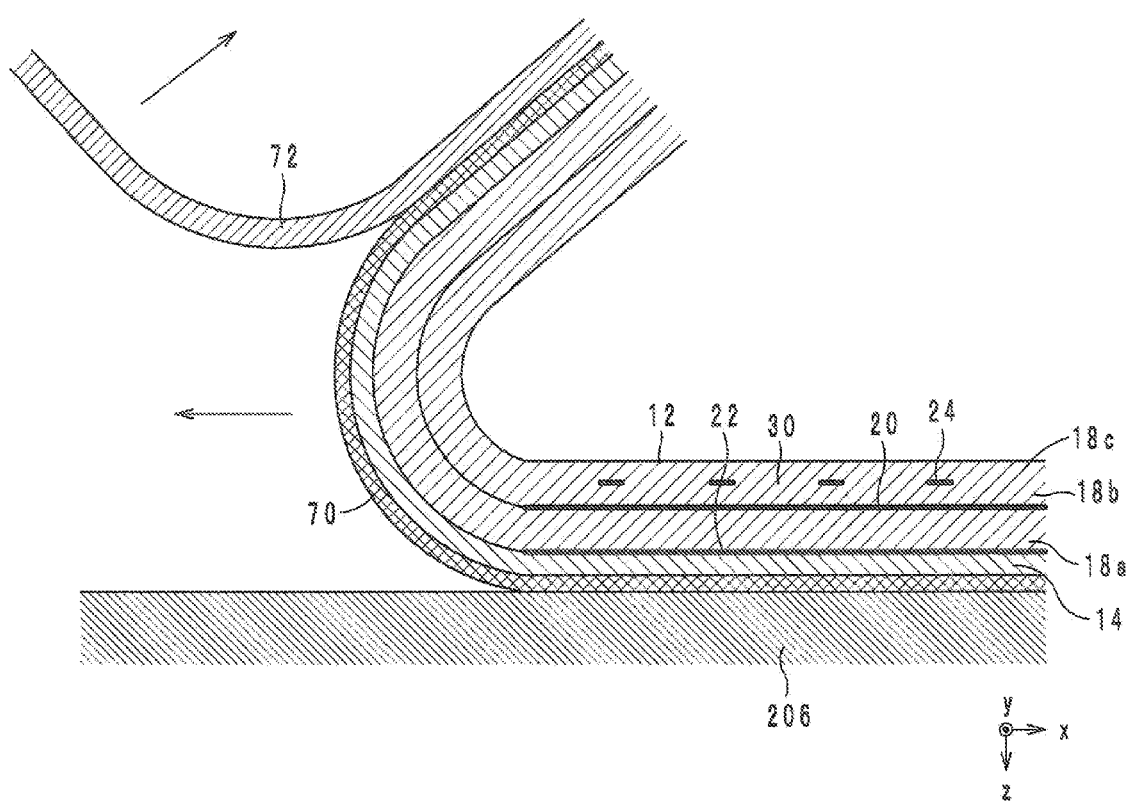
FIG. 26 is a cross-sectional view of a high-frequency signal transmission line and a battery pack to which the high-frequency signal transmission line is bonded.

An exemplary method of bonding the high-frequency signal transmission line 10g to the battery pack 206 will be described below with reference to the accompanying drawings. FIG. 26 is a cross-sectional view of the high-frequency signal transmission line 10g and the battery pack 206 to which the high-frequency signal transmission line 10g is bonded.

First, as illustrated in FIG. 21, the cover sheet 72 is partly detached from the adhesive layer 70. The exposed portion of the adhesive layer 70 is bonded to the battery pack 206.

Subsequently, as illustrated in FIG. 26, the adhesive layer 70 is bonded to the battery pack 206 while detaching the cover sheet 72 from the adhesive layer 70. Thus, the high-frequency signal transmission line 10g is bonded to the battery pack 206 using a procedure similar to a procedure for the placement of a sticky label. Referring to FIG. 26, the structures of the ground conductors 22 and 24 and the signal line 20 are partly illustrated.

The high-frequency signal transmission line 10g having the above-described structure can be fixed to an article in a narrow space. More specifically, components such as a fixing bracket and a screw for fixing the high-frequency signal transmission line 10g to an article becomes unnecessary. As a result, the high-frequency signal transmission line 10g can be fixed to an article in a narrow space in an electronic apparatus. Furthermore, since a screw for fixing the high-frequency signal transmission line 10g to an article is not used, no screw hole is formed at the battery pack 206.

As illustrated in FIG. 26, in the high-frequency signal transmission line 10g, the adhesive layer 70 is bonded to the battery pack 206 while detaching the cover sheet 72 from the adhesive layer 70. Thus, the high-frequency signal transmission line 10g is bonded to the battery pack 206 using a procedure similar to a procedure for the placement of a sticky label. Accordingly, in the high-frequency signal transmission line 10g, it is unnecessary to perform screwing with a fixed structure for the coaxial cable disclosed in Japanese Unexamined Patent Application Publication No. 2007-123740. The high-frequency signal transmission line 10g can be easily fixed to the battery pack 206.

Since the high-frequency signal transmission line 10g does not need components such as a fixing bracket and a screw, no stray capacitance is generated between the signal line 20 and each of the fixing bracket and the screw. Accordingly, the deviation of the characteristic impedance of the high-frequency signal transmission line 10g from a predetermined characteristic impedance is significantly reduced and prevented.

Figure 27:
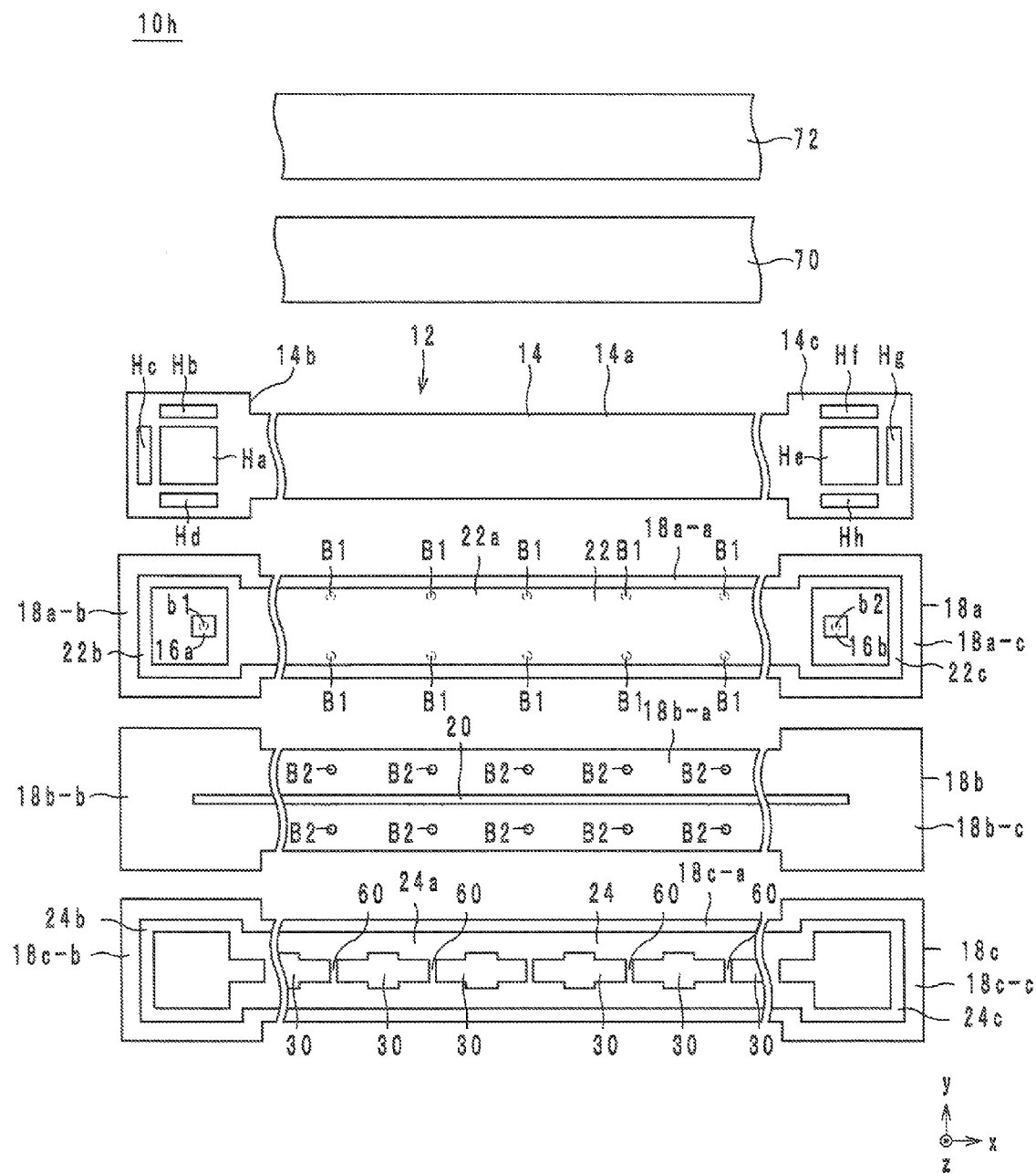
FIG. 27 is an exploded view of a laminate in a high-frequency signal transmission line according to a first modification of the second preferred embodiment of the present invention.

The structure of a high-frequency signal transmission line according to the first modification of the second preferred embodiment of the present invention will be described below with reference to the accompanying drawing. FIG. 27 is an exploded view of the laminate 12 in a high-frequency signal transmission line 10h according to the first modification.

Like the high-frequency signal transmission line 10h illustrated in FIG. 27, the high-frequency signal transmission line 10a may include the adhesive layer 70 and the cover sheet 72.

Figure 28:
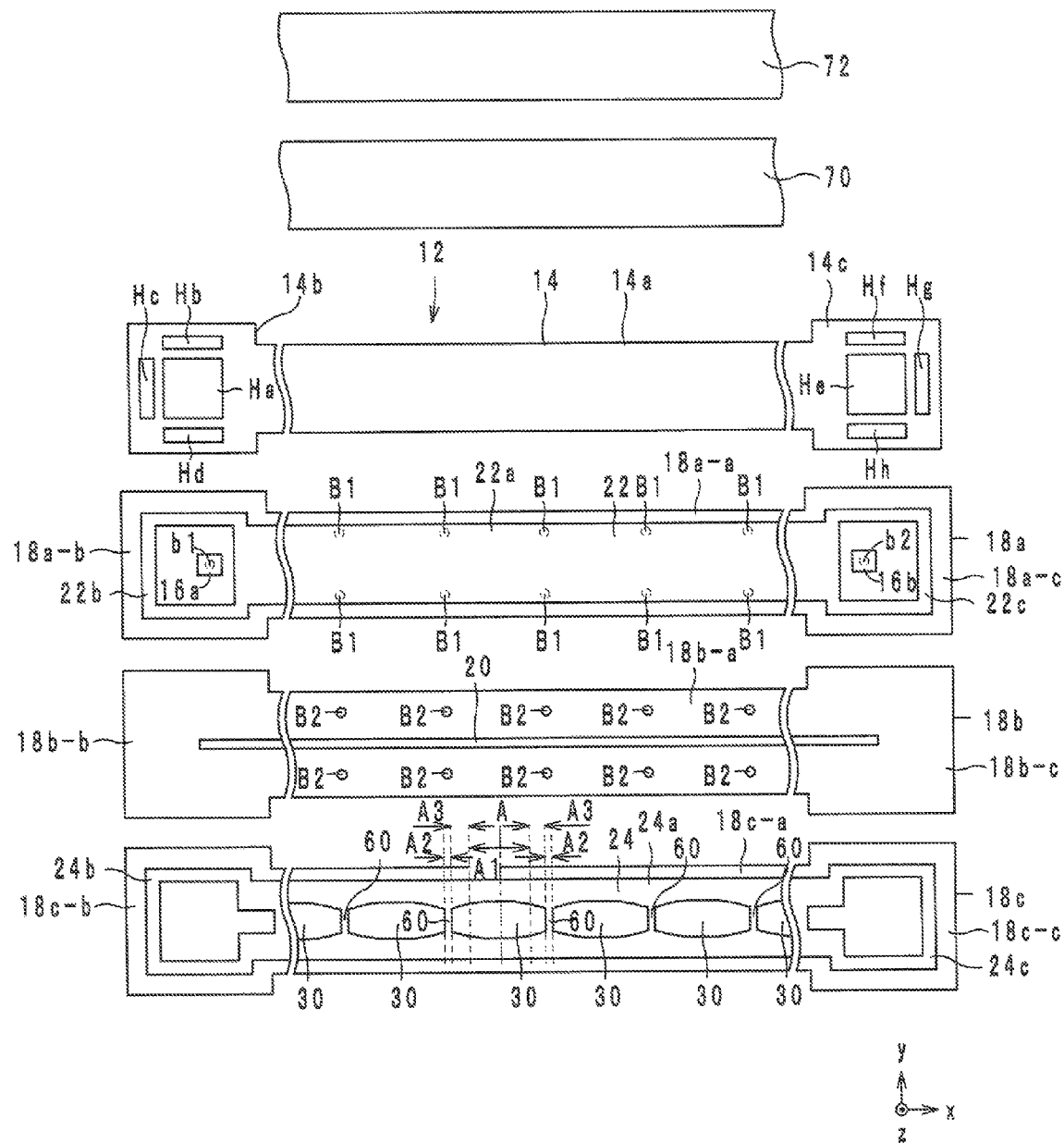
FIG. 28 is an exploded view of a laminate in a high-frequency signal transmission line according to a second modification of the second preferred embodiment of the present invention.

A high-frequency signal transmission line according to the second modification of the second preferred embodiment of the present invention will be described below with reference to the accompanying drawing. FIG. 28 is an exploded view of the laminate 12 in a high-frequency signal transmission line 10i according to the second modification.

Like the high-frequency signal transmission line 10i illustrated in FIG. 28, the high-frequency signal transmission line 10b may include the adhesive layer 70 and the cover sheet 72.

Figure 29:
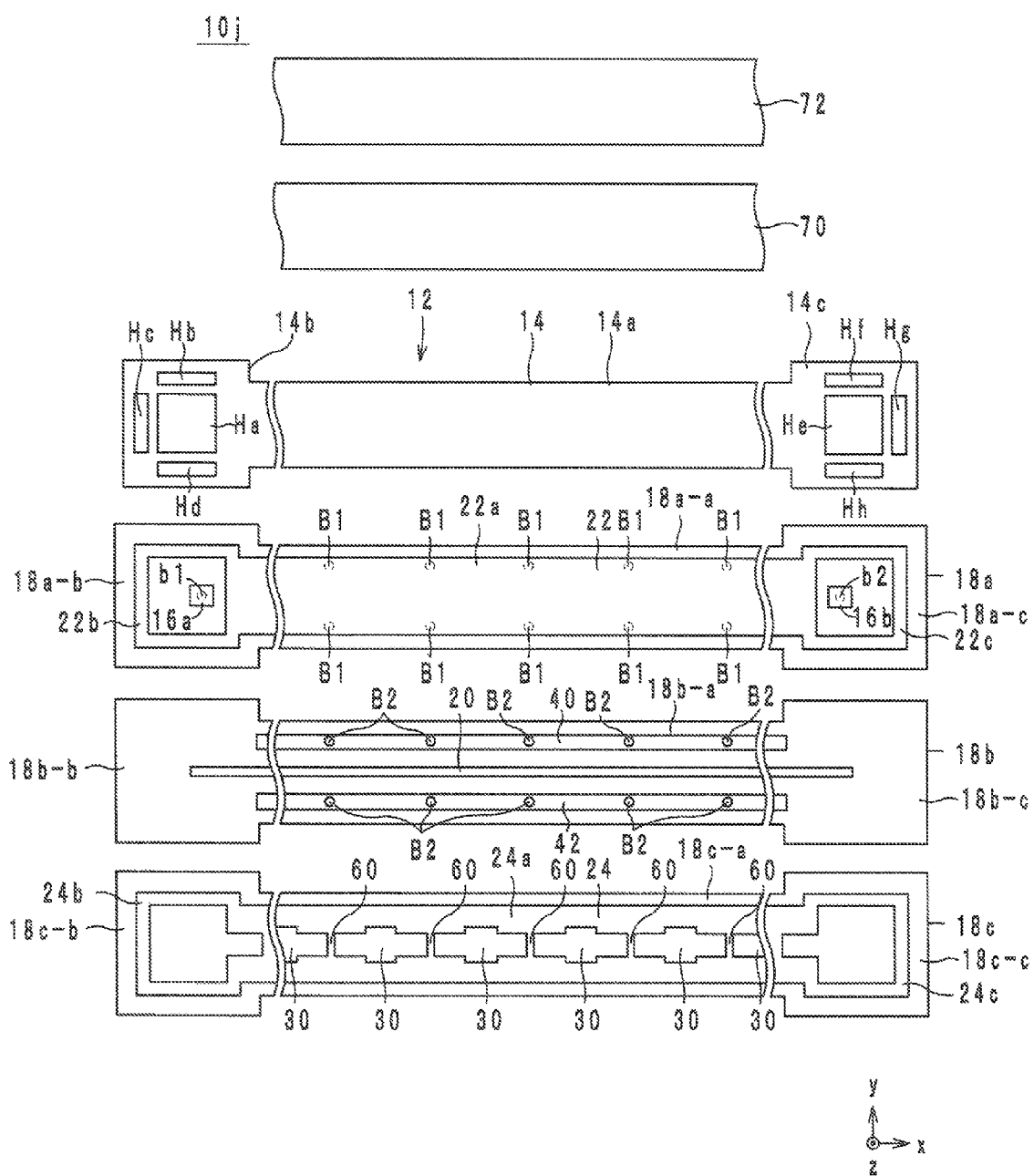
FIG. 29 is an exploded view of a laminate in a high-frequency signal transmission line according to a third modification of the second preferred embodiment of the present invention.

A high-frequency signal transmission line according to the third modification of the second preferred embodiment of the present invention will be described below with reference to the accompanying drawing. FIG. 29 is an exploded view of the laminate 12 in a high-frequency signal transmission line 10j according to the third modification.

Like the high-frequency signal transmission line 10j illustrated in FIG. 29, the high-frequency signal transmission line 10c may include the adhesive layer 70 and the cover sheet 72.

Figure 30:
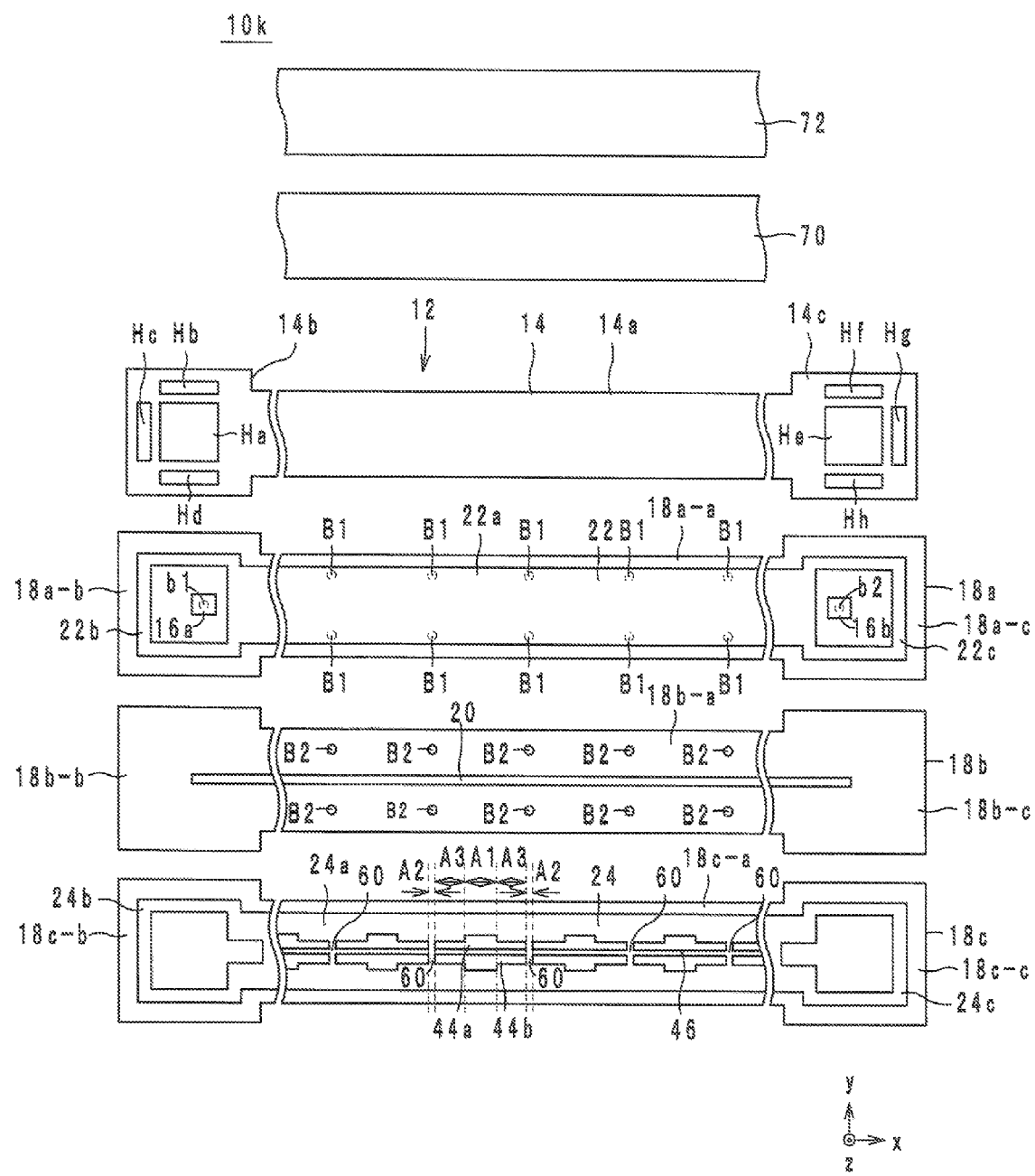
FIG. 30 is an exploded view of a laminate in a high-frequency signal transmission line according to a fourth modification of the second preferred embodiment of the present invention.

A high-frequency signal transmission line according to the fourth modification of the second preferred embodiment of the present invention will be described below with reference to the accompanying drawing. FIG. 30 is an exploded view of the laminate 12 in a high-frequency signal transmission line 10k according to the fourth modification.

Like the high-frequency signal transmission line 10k illustrated in FIG. 30, the high-frequency signal transmission line 10d may include the adhesive layer 70 and the cover sheet 72.

Figure 31:
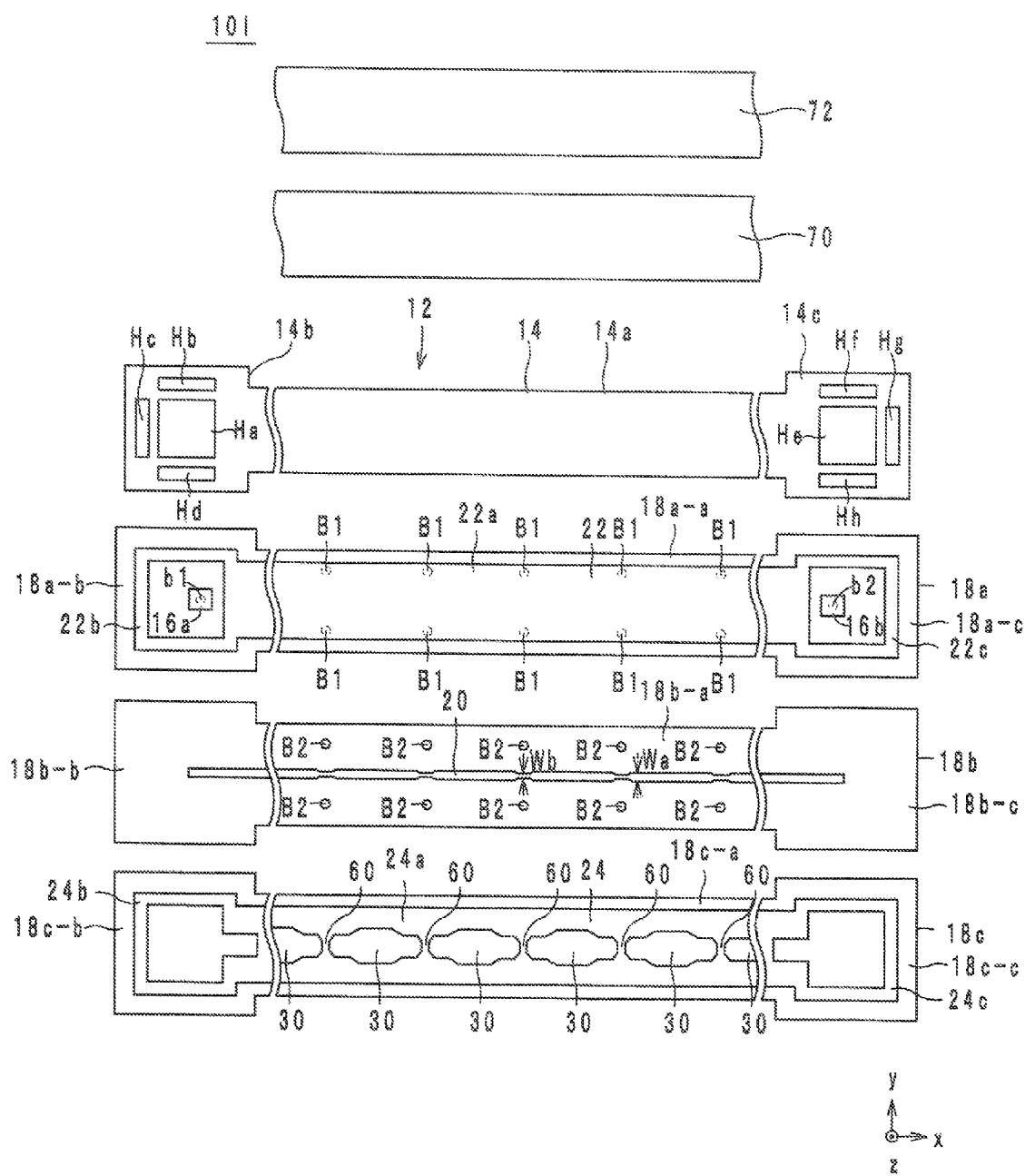
FIG. 31 is an exploded view of a laminate in a high-frequency signal transmission line according to a fifth modification of the second preferred embodiment of the present invention.

A high-frequency signal transmission line according to the fifth modification of the second preferred embodiment of the present invention will be described below with reference to the accompanying drawing. FIG. 31 is an exploded view of the laminate 12 in a high-frequency signal transmission line 10l according to the fifth modification.

Like the high-frequency signal transmission line 10l illustrated in FIG. 31, the high-frequency signal transmission line 10e may include the adhesive layer 70 and the cover sheet 72.

Figure 32:
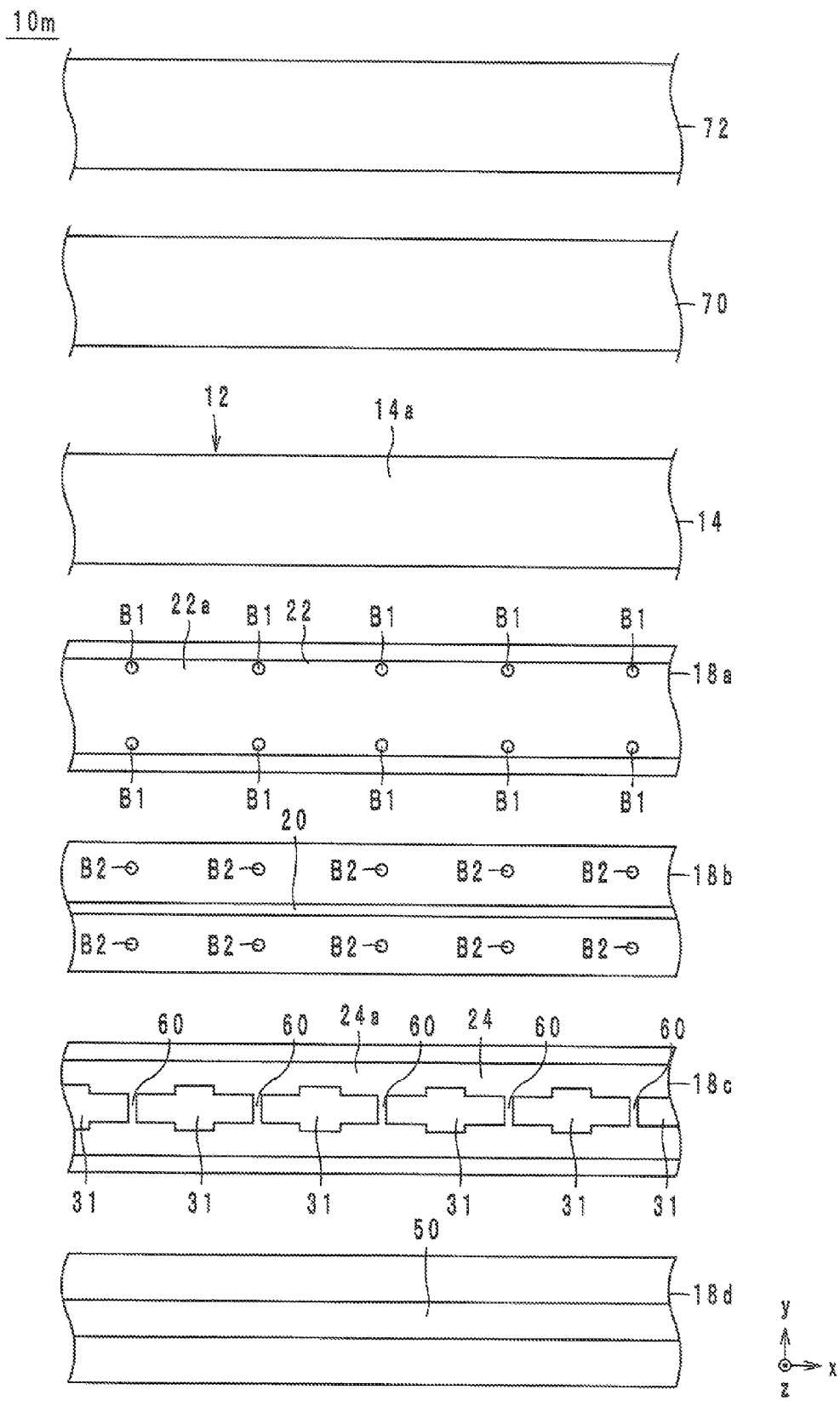
FIG. 32 is an exploded view of a laminate in a high-frequency signal transmission line according to a sixth modification of the second preferred embodiment of the present invention.

A high-frequency signal transmission line according to the sixth modification of the second preferred embodiment of the present invention will be described below with reference to the accompanying drawing. FIG. 32 is an exploded view of the laminate 12 in a high-frequency signal transmission line 10m according to the sixth modification.

Like the high-frequency signal transmission line 10m illustrated in FIG. 32, the high-frequency signal transmission line 10f may include the adhesive layer 70 and the cover sheet 72.

Figure 33:
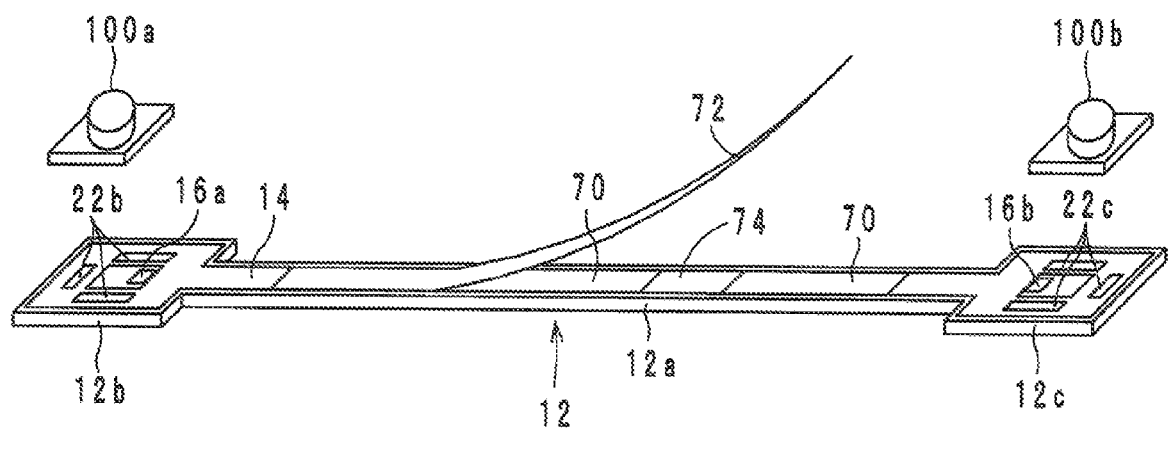
FIG. 33 is an external perspective view of a high-frequency signal transmission line according to a seventh modification of the second preferred embodiment of the present invention.
Figure 34:
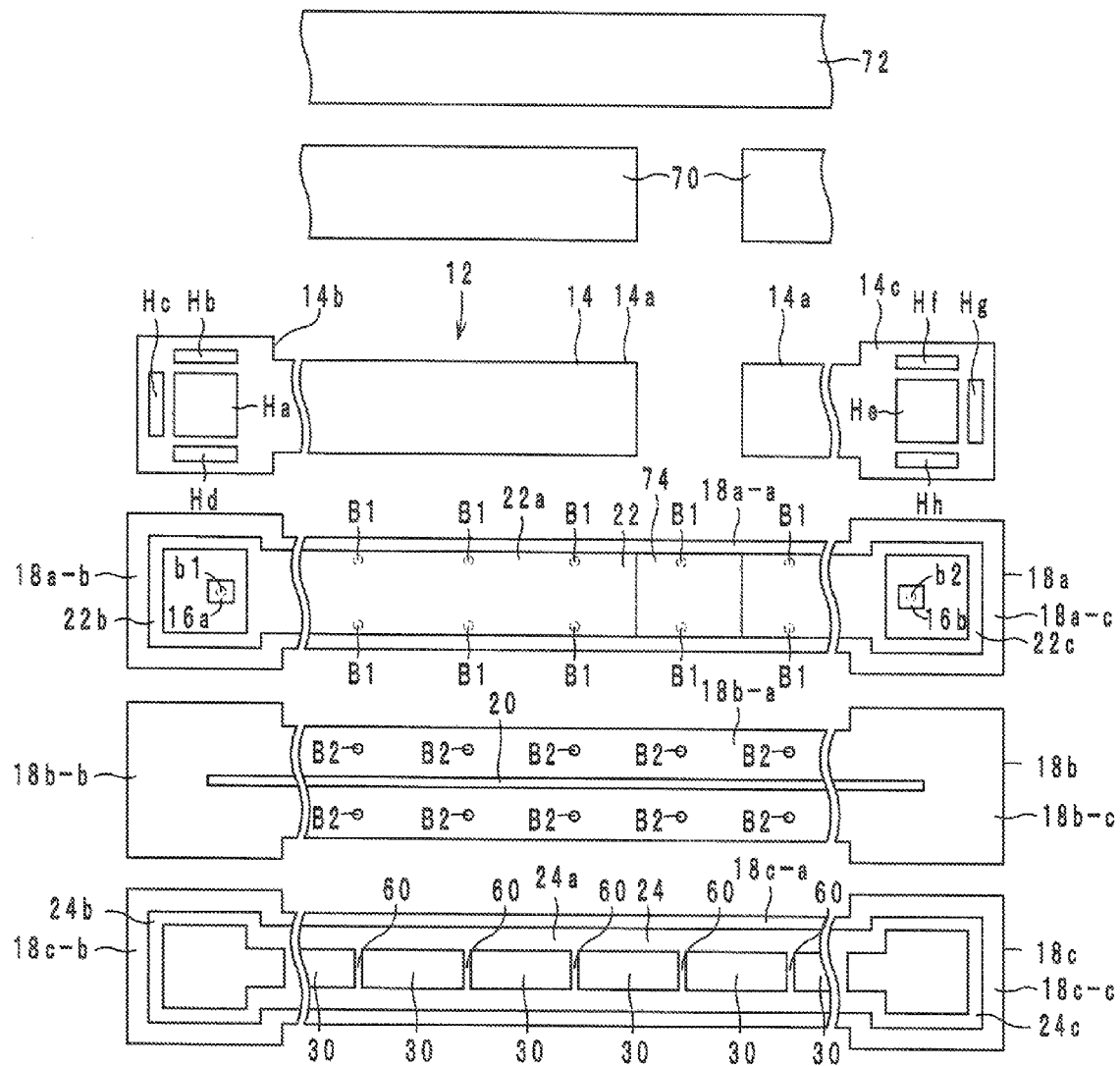
FIG. 34 is an exploded view of a dielectric body in the high-frequency signal transmission line illustrated in FIG. 33.
Figure 35:
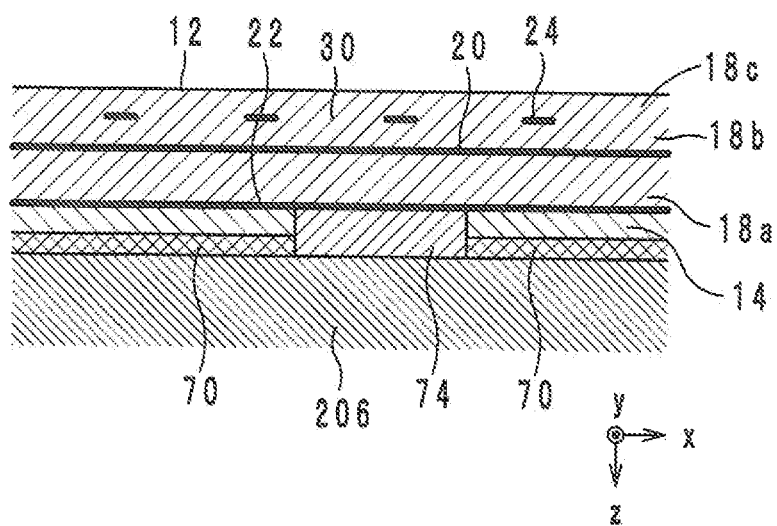
FIG. 35 is a cross-sectional view of the high-frequency signal transmission line illustrated in FIG. 33.

A high-frequency signal transmission line according to the seventh modification of the second preferred embodiment of the present invention will be described below with reference to the accompanying drawings. FIG. 33 is an external perspective view of a high-frequency signal transmission line 10n according to the seventh modification. FIG. 34 is an exploded view of the dielectric body 12 in the high-frequency signal transmission line 10n illustrated in FIG. 33. FIG. 35 is a cross-sectional view of the high-frequency signal transmission line 10n illustrated in FIG. 33.

The difference between the high-frequency signal transmission lines 10n and 10g is that the adhesive layer 70 is partly absent and a pad 74 is disposed. More specifically, as illustrated in FIGS. 33 and 34, the line portion 14a of the protection layer 14 and the adhesive layer 70 are partly absent. The pad 74 made of solder is preferably provided at a position at which the line portion 14a of the protection layer 14 and the adhesive layer 70 are absent. The pad 74 is provided on the ground conductor 22, and is connected to the ground conductor 22.

As illustrated in FIG. 35, the high-frequency signal transmission line 10n having the above-described structure is fixed to the battery pack 206 covered with a metal cover via the adhesive layer 70. At that time, the pad 74 is in contact with the metal cover of the battery pack 206. As a result, the ground conductor 22 is electrically connected to the metal cover of the battery pack 206 via the pad 74. Under the condition that the metal cover is held at a ground potential, the ground conductor 22 is held at the ground potential not only via the connectors 100a and 100b but also via the metal cover. That is, the potential of the ground conductor 22 is more stably brought close to the ground potential.

Instead of the metal cover of the battery pack 206, the pad 74 may be in contact with the metal casing of an electronic apparatus or the land of a printed circuit board.

Figure 36:
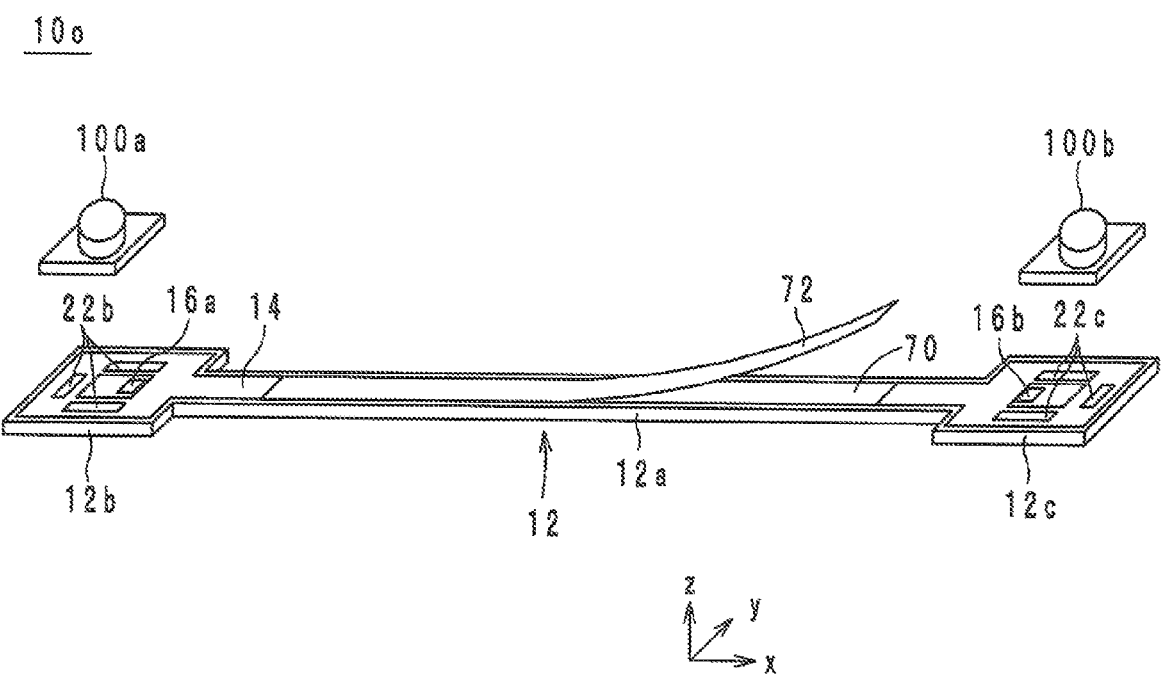
FIG. 36 is an external perspective view of a high-frequency signal transmission line according to an eighth modification of the second preferred embodiment of the present invention.
Figure 37:
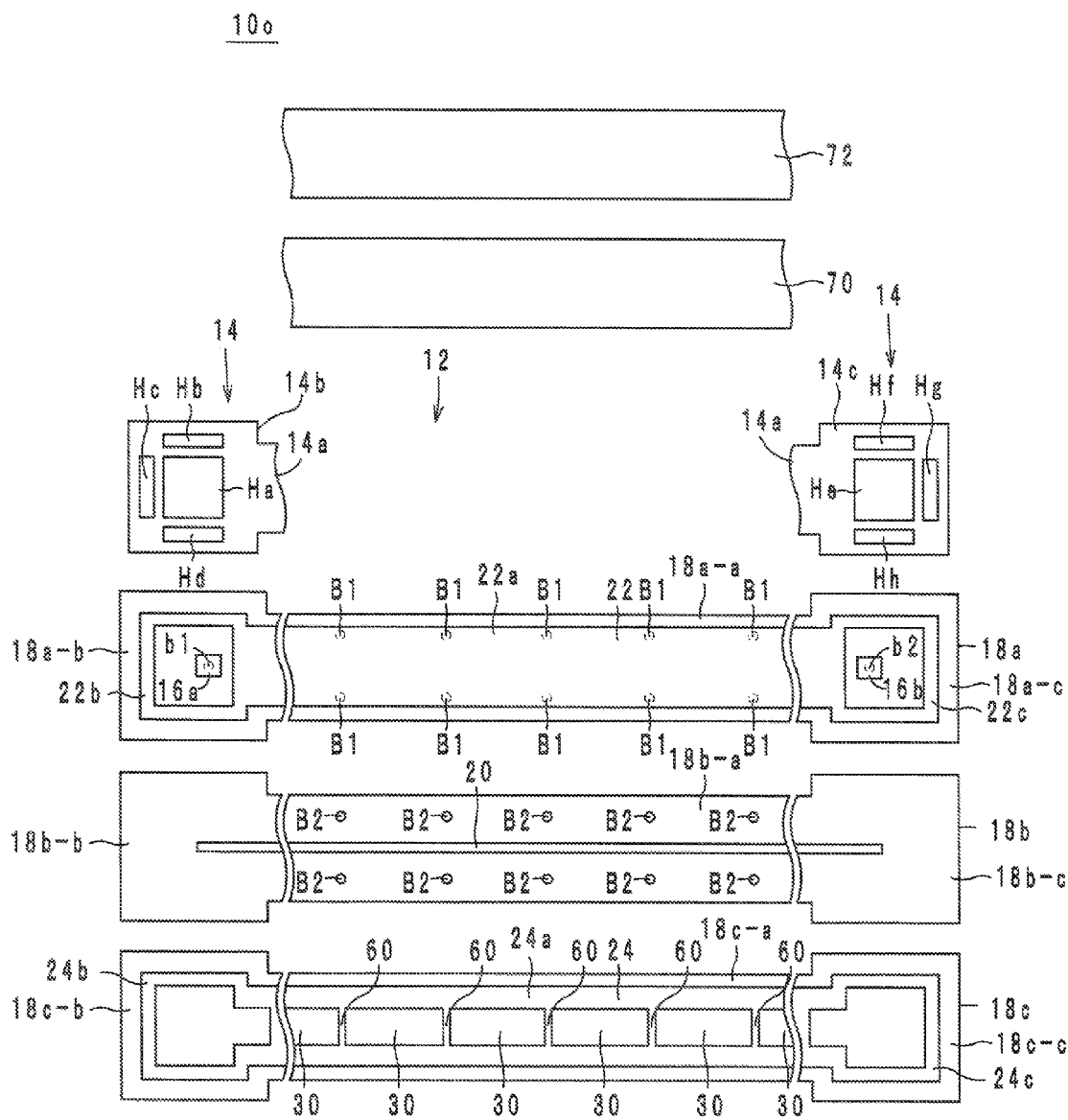
FIG. 37 is an exploded view of a dielectric body in the high-frequency signal transmission line illustrated in FIG. 36.
Figure 38:
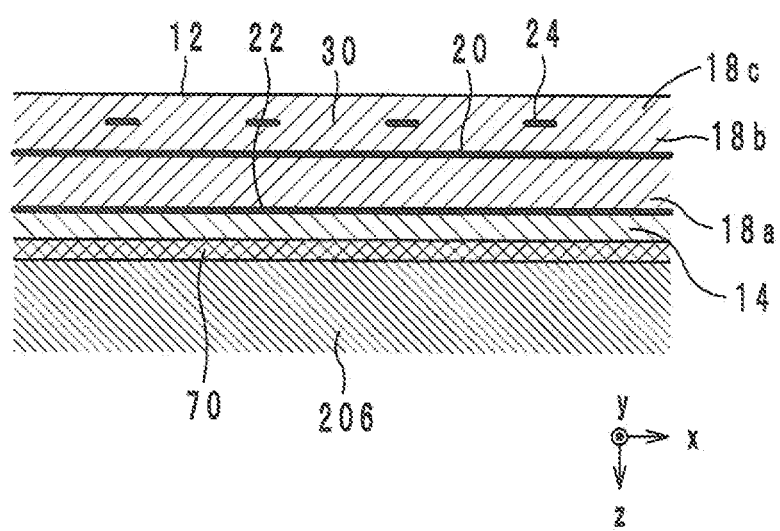
FIG. 38 is a cross-sectional view of the high-frequency signal transmission line illustrated in FIG. 36.

A high-frequency signal transmission line according to the eighth modification of a preferred embodiment of the present invention will be described below with reference to the accompanying drawings. FIG. 36 is an external perspective view of a high-frequency signal transmission line 10o according to the eighth modification. FIG. 37 is an exploded view of the dielectric body 12 in the high-frequency signal transmission line 10o illustrated in FIG. 36. FIG. 38 is a cross-sectional view of the high-frequency signal transmission line 10o illustrated in FIG. 36.

The difference between the high-frequency signal transmission lines 10o and 10g is that the adhesive layer 70 is a conductive adhesive. More specifically, as illustrated in FIGS. 36 and 37, a part of the line portion 14a of the protection layer 14 is absent. The ground conductor 22 is therefore disposed on the first main surface of the dielectric body 12. At a position at which the line portion 14a is absent, the adhesive layer 70 and the cover sheet 72 are provided. As a result, the adhesive layer 70 is provided on the ground conductor 22, and is connected to the ground conductor 22.

As illustrated in FIG. 38, the high-frequency signal transmission line 10o having the above-described structure is fixed to the battery pack 206 covered with a metal cover (conductive portion) via the adhesive layer 70. At that time, the adhesive layer 70 is in contact with the metal cover of the battery pack 206. As a result, the ground conductor 22 is electrically connected to the metal cover of the battery pack 206 via the adhesive layer 70. Under the condition that the metal cover is held at a ground potential, the ground conductor 22 is held at the ground potential not only via the connectors 100a and 100b but also via the metal cover. That is, the potential of the ground conductor 22 is more stably brought close to the ground potential.

Figure 39:
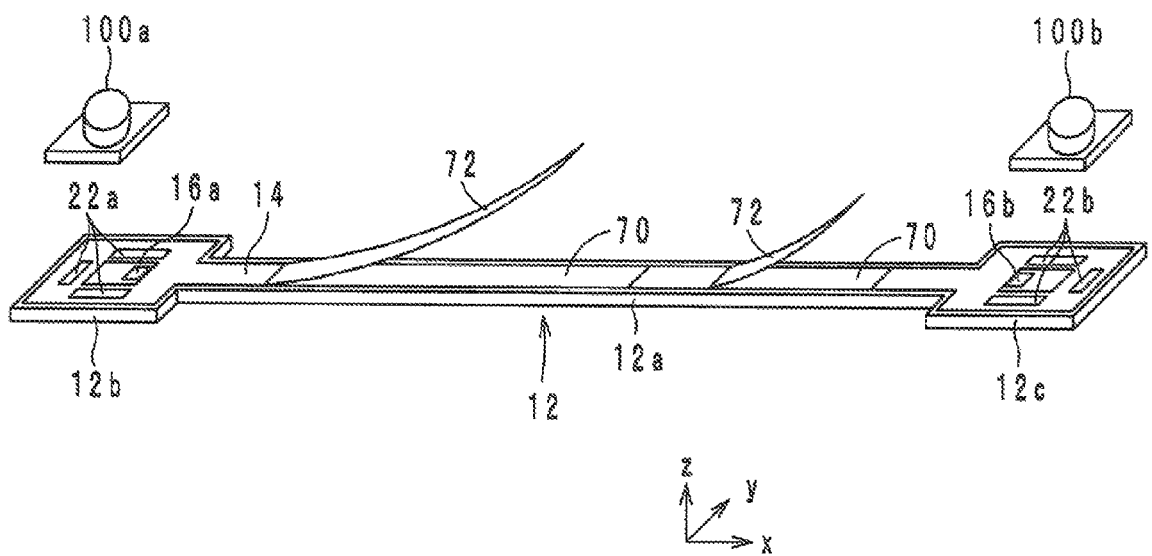
FIG. 39 is an external perspective view of a high-frequency signal transmission line according to a ninth modification of the second preferred embodiment of the present invention.
Figure 40:
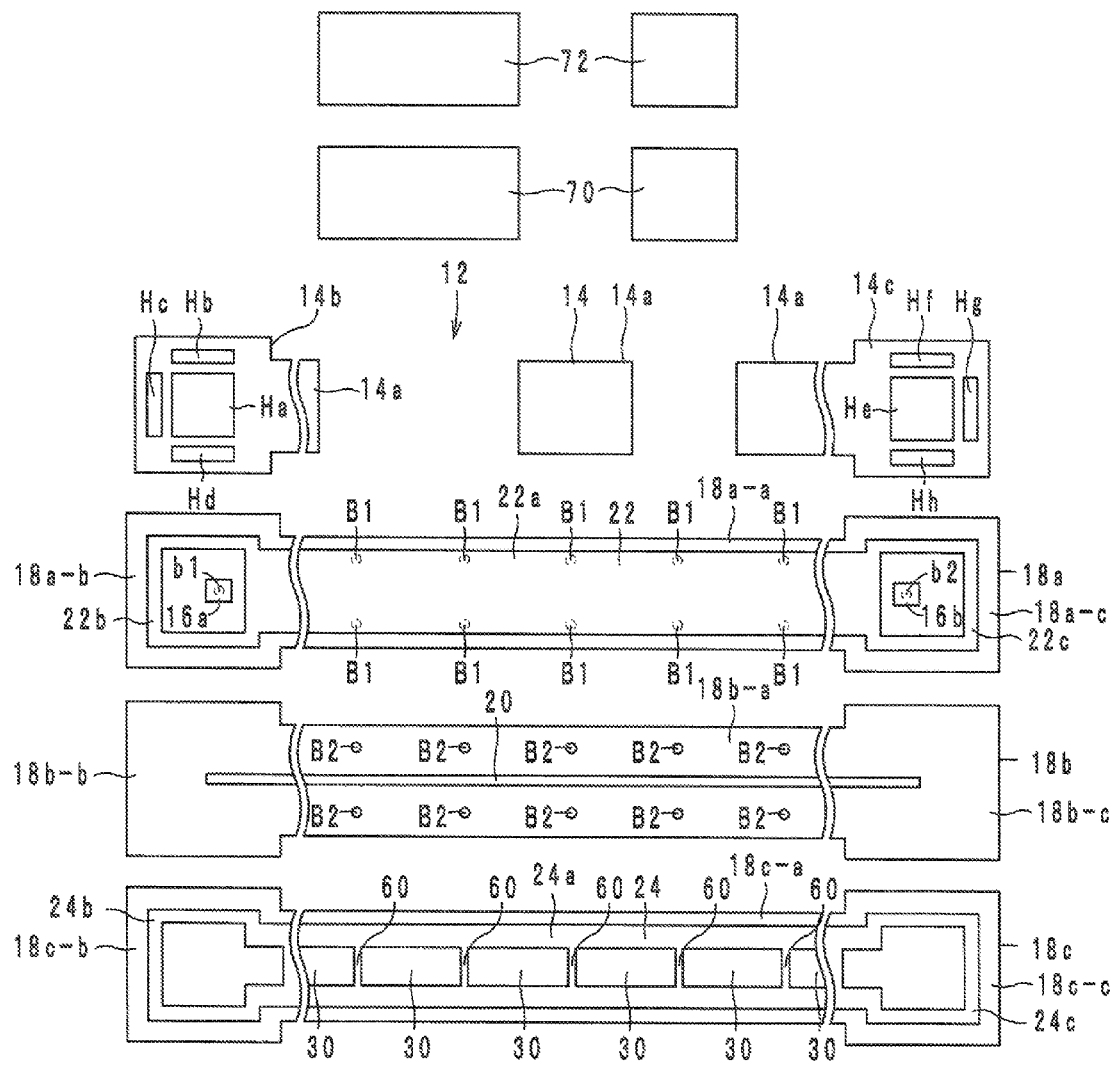
FIG. 40 is an exploded view of a dielectric body in the high-frequency signal transmission line illustrated in FIG. 39.
Figure 41:
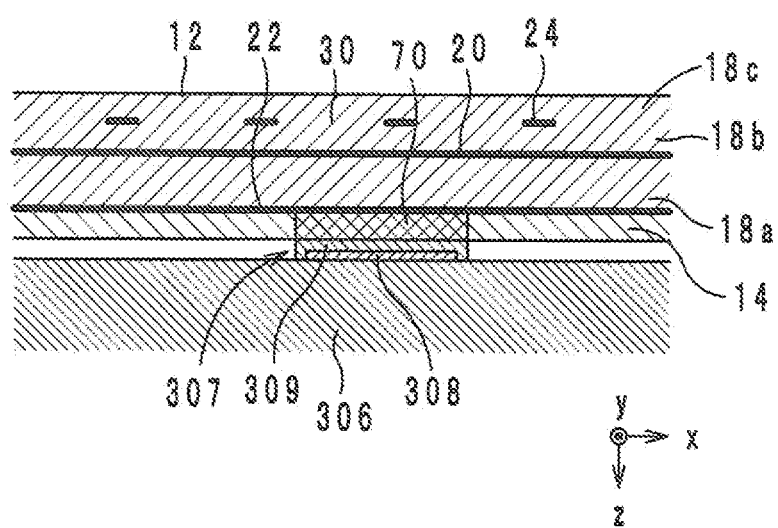
FIG. 41 is a cross-sectional view of the high-frequency signal transmission line illustrated in FIG. 39.

A high-frequency signal transmission line according to the ninth modification of a preferred embodiment of the present invention will be described below with reference to the accompanying drawings. FIG. 39 is an external perspective view of a high-frequency signal transmission line 10p according to the ninth modification. FIG. 40 is an exploded view of the dielectric body 12 in the high-frequency signal transmission line 10p illustrated in FIG. 39. FIG. 41 is a cross-sectional view of the high-frequency signal transmission line 10p illustrated in FIG. 39.

As illustrated in FIGS. 39 and 40, the difference between the high-frequency signal transmission lines 10p and 10o is that each of the adhesive layer 70 and the cover sheet 72 is divided into two portions.

As illustrated in FIG. 41, the high-frequency signal transmission line 10p having the above-described structure is fixed to a printed circuit board 306 with a land (conductive portion) 307 thereon via the adhesive layer 70. The land 307 is obtained preferably by applying a coating 309 to a base electrode 308 made of, for example, Cu. The adhesive layer 70 is in contact with the land 307. As a result, the ground conductor 22 is electrically connected to the land 307 via the adhesive layer 70. Under the condition that land 307 is held at a ground potential, the ground conductor 22 is held at the ground potential not only via the connectors 100a and 100b but also via the land 307. That is, the potential of the ground conductor 22 is more stably brought close to the ground potential.

Since the adhesive layer 70 is divided into a plurality of portions, the occurrence of wrinkles and sagging at the high-frequency signal transmission line 10p is significantly reduced and prevented at the time of placement of the high-frequency signal transmission line 10p. The two adhesive layers are preferably in contact with an article such as a land so that they are held at a ground potential. Only one of the two adhesive layers may be held at the ground potential, or none of them may be connected to the ground.

Figure 42:
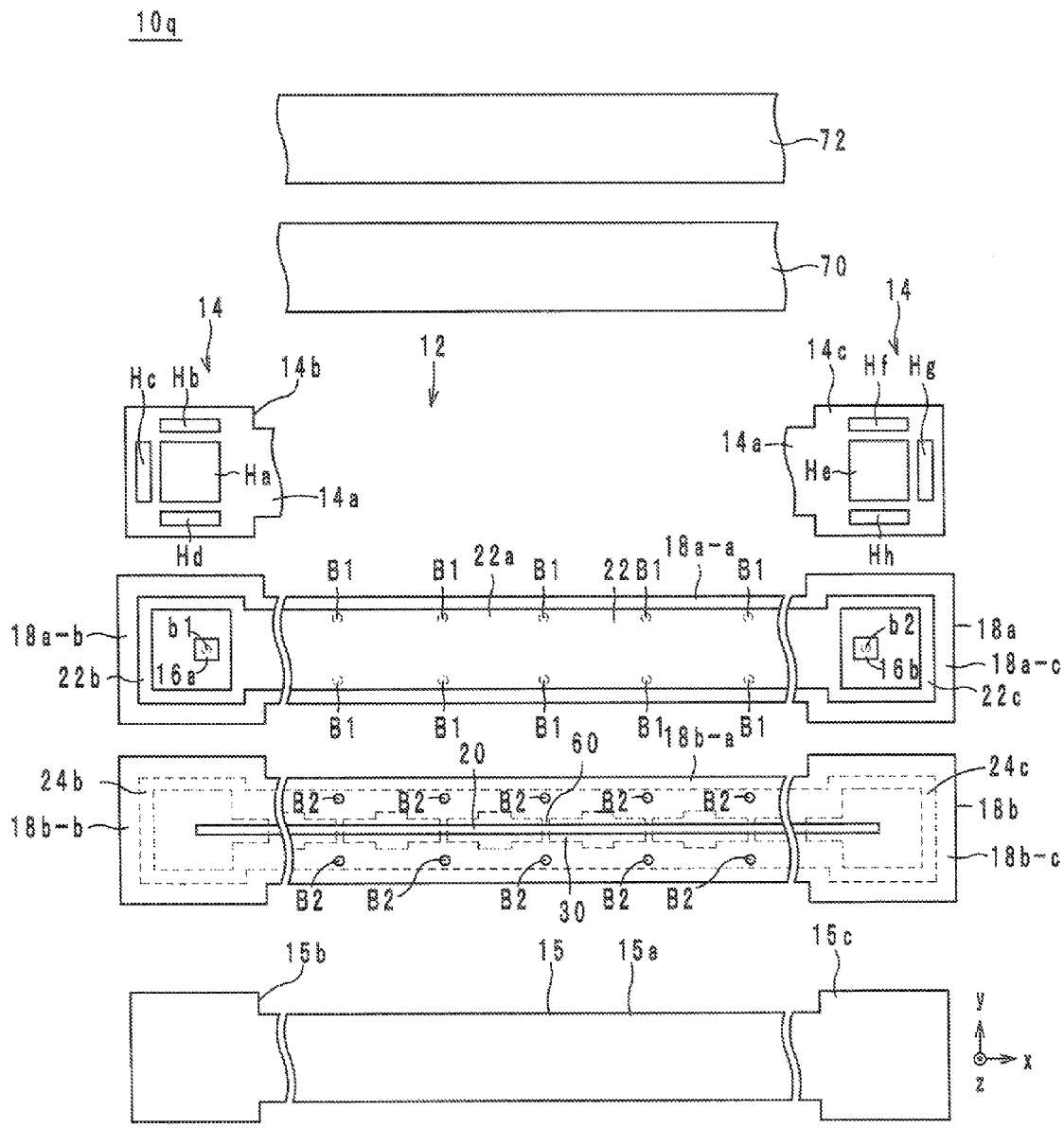
FIG. 42 is an exploded view of a dielectric body in a high-frequency signal transmission line according to a tenth modification of the second preferred embodiment of the present invention.

A high-frequency signal transmission line according to the tenth modification of a preferred embodiment of the present invention will be described below with reference to the accompanying drawing. FIG. 42 is an exploded view of the dielectric body 12 in a high-frequency signal transmission line 10q according to the tenth modification.

The difference between the high-frequency signal transmission lines 10q and 10o is that the ground conductor 24 is disposed on the undersurface of the dielectric sheet 18b. More specifically, the signal line 20 is disposed on the surface of the dielectric sheet 18b, and the ground conductor 24 is disposed on the undersurface of the dielectric sheet 18b. In the high-frequency signal transmission line 10q, the dielectric sheet 18c is not provided and a protection layer 15 is provided.

Since the high-frequency signal transmission line 10q having the above-described structure preferably includes only two dielectric sheets 18, the high-frequency signal transmission line 10q can be easily created.

Other Preferred Embodiments

A high-frequency signal transmission line according to the present invention is not limited to the high-frequency signal transmission lines 10 and 10a to 10q according to the above-described preferred embodiments of the present invention and modifications thereof, and various changes can be made to these high-frequency signal transmission lines without departing from the scope of the present invention.

In the high-frequency signal transmission lines 10 and 10a to 10q, a plurality of openings 30 preferably have the same shape, but may have different shapes. For example, the length of a predetermined one of the openings 30 in the x-axis direction may be longer than that of the other ones of the openings 30 in the x-axis direction. As a result, in a region where the predetermined one of the openings 30 is formed, the high-frequency signal transmission lines 10 and 10a to 10q can be easily bent.

The structures of the high-frequency signal transmission lines 10 and 10a to 10q may be combined.

In the high-frequency signal transmission lines 10a to 10q, the characteristic impedance of the signal line 20 preferably changes such that, with increasing proximity to the other one of two adjacent bridge portions 60 from one of them, the characteristic impedance increases in the order of the minimum value Z2, the intermediate value Z3, and the maximum value Z1 and then decreases in the order of the maximum value Z1, the intermediate value Z3, and the minimum value Z2. However, the characteristic impedance of the signal line 20 may change such that, with increasing proximity to the other one of two adjacent bridge portions 60 from one of them, the characteristic impedance increases in the order of the minimum value Z2, the intermediate value Z3, and the maximum value Z1 and then decreases in the order of the maximum value Z1, an intermediate value Z4, and the minimum value Z2. That is, the different intermediate values Z3 and Z4 may be used. For example, each of the openings 30, 31, 44a, and 44 may not be symmetric with respect to the line A. The intermediate value Z4 needs to be larger than the minimum value Z2 and smaller than the maximum value Z1.

Between two adjacent bridge portions 60, different minimum values Z2 may be obtained. That is, on the condition that the high-frequency signal transmission lines 10a to 10q have the predetermined characteristic impedance, the minimum values Z2 do not necessarily have to be the same. However, the minimum value Z2 obtained in one of the bridge portions 60 is preferably smaller than the intermediate value Z3, and the minimum value Z2 obtained in the other one of the bridge portions 60 is preferably smaller than the intermediate value Z4.

The adhesive layer 70 and the cover sheet 72 may further be provided on the second main surface of the dielectric body 12.

As described previously, preferred embodiments of the present invention are useful for a high-frequency signal transmission line and an electronic apparatus, and, in particular, provide an advantage in terms of suitability to fix a high-frequency signal transmission line to an article in a narrow space.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic apparatus comprising a first article, a second article and a high-frequency signal transmission line, the high-frequency signal transmission line comprising:
   an element assembly including one or more insulating layers, and a first main surface and a second main surface;
   a linear signal line disposed in the element assembly;
   a first ground conductor that faces the signal line at a first distance and continuously extends along the signal line, the first ground conductor being located on or at a side of the first main surface with respect to the signal line; and
   a second ground conductor that faces the signal line at a second distance smaller than the first distance, and includes a plurality of openings arranged along the signal line, the second ground conductor being located on or at a side of the second main surface with respect to the signal line; wherein a main surface of the high-frequency signal transmission line that is located near the first ground conductor with respect to the signal line is in contact with the first article; and a main surface of the high-frequency signal transmission line that is located near the second ground conductor with respect to the signal line faces the second article at a specified distance.

2. The electronic apparatus according to claim 1, wherein the main surface of the high-frequency signal transmission line that is located near the first ground conductor with respect to the signal line is fixed to the first article.

3. The electronic apparatus according to claim 1, wherein the second article is a casing, or a conductive portion of a casing, or an electronic component provided in a casing.

4. The electronic apparatus according to claim 1, wherein the element assembly is flexible.

5. The electronic apparatus according to claim 1, wherein the second ground conductor has a ladder shape defined by the plurality of openings and bridges arranged alternately along the signal line; and a characteristic impedance of the signal line changes between two adjacent ones of the bridges in such a manner that, with increasing distance from one of the two adjacent bridges and with decreasing distance to the other of the two adjacent bridges, the characteristic impedance increases in an order of a minimum value, a first intermediate value, and a maximum value and then decreases in an order of the maximum value, a second intermediate value, and the minimum value.

6. The electronic apparatus according to claim 1, wherein the first article is a metal article.

7. The electronic apparatus according to claim 6, wherein the first ground conductor is electrically connected to the first article.

* * * * *